(12) United States Patent
Morimoto et al.

(10) Patent No.: US 11,784,195 B2
(45) Date of Patent: Oct. 10, 2023

(54) PHOTOELECTRIC CONVERSION APPARATUS AND PHOTODETECTION SYSTEM

(71) Applicant: CANON KABUSHIKI KAISHA, Tokyo (JP)

(72) Inventors: Kazuhiro Morimoto, Kanagawa (JP); Wataru Endo, Tokyo (JP); Fumihiro Inui, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 14 days.

(21) Appl. No.: 17/559,651

(22) Filed: Dec. 22, 2021

(65) Prior Publication Data

US 2022/0216251 A1 Jul. 7, 2022

(30) Foreign Application Priority Data

Jan. 7, 2021 (JP) ................................. 2021-001442
Nov. 11, 2021 (JP) ................................. 2021-184190

(51) Int. Cl.
*H01L 27/146* (2006.01)
*H04N 23/73* (2023.01)
*H04N 25/773* (2023.01)
*H04N 25/53* (2023.01)
*H04N 23/667* (2023.01)
*H04N 25/71* (2023.01)

(52) U.S. Cl.
CPC .. *H01L 27/14609* (2013.01); *H01L 27/14643* (2013.01); *H04N 23/73* (2023.01); *H04N 25/773* (2023.01)

(58) Field of Classification Search
CPC ......... H01L 27/14609; H01L 27/14643; H01L 27/14605; H01L 27/14641; H04N 23/73; H04N 25/773; H04N 25/53; H04N 23/667; H04N 25/745; H04N 25/00; H04N 25/50; H04N 25/571; H04N 25/573; H04N 25/60; H04N 25/621; H04N 25/67; H04N 25/70; H04N 25/76; H04N 25/77; H04N 25/772
See application file for complete search history.

(56) References Cited

U.S. PATENT DOCUMENTS 11,340,109 B2 * 5/2022 Hennecke ............. G01S 7/4863
2019/0305030 A1 * 10/2019 Maehashi ............. H04N 25/772
2019/0327424 A1 * 10/2019 Sasaki ................... H04N 25/772

FOREIGN PATENT DOCUMENTS

JP 2020123847 A 8/2020

* cited by examiner

*Primary Examiner* — Albert H Cutler
(74) *Attorney, Agent, or Firm* — Canon U.S.A., Inc. I.P. Division

(57) ABSTRACT

An apparatus includes a photodiode including an anode and a cathode, a switch connected to a node of one of the anode and the cathode and to a power supply line via which a driving voltage is supplied, and functioning to switch a resistance value between the node and the power supply line, and a generation unit configured to generate a pulse signal for controlling switching of the switch. The apparatus is operable in one of two modes including a first mode and a second mode, the second mode being usable in a lower luminance condition than a luminance condition in the first mode. In an exposure period for acquiring one frame of signals, the number of pulse signals in the second mode is smaller than in the first mode.

21 Claims, 22 Drawing Sheets

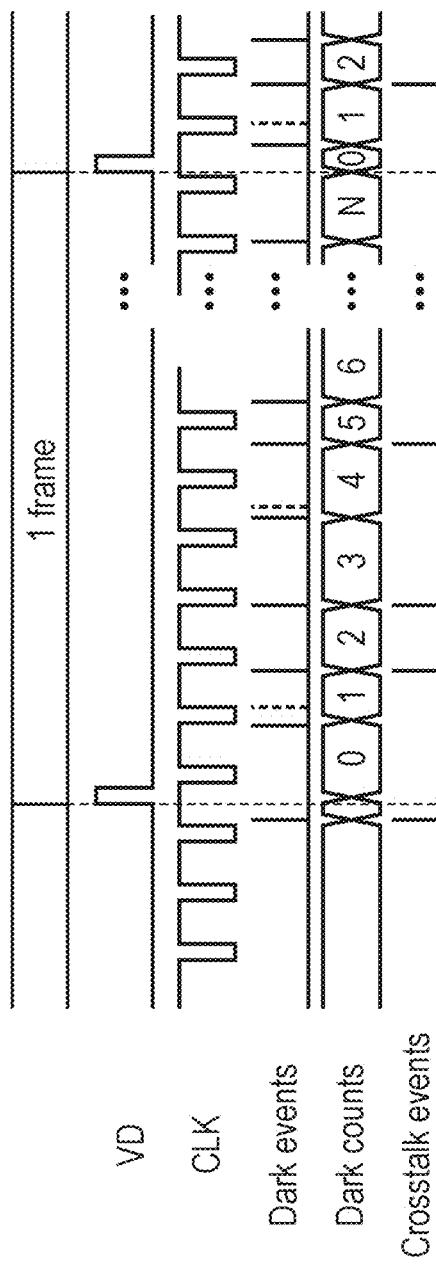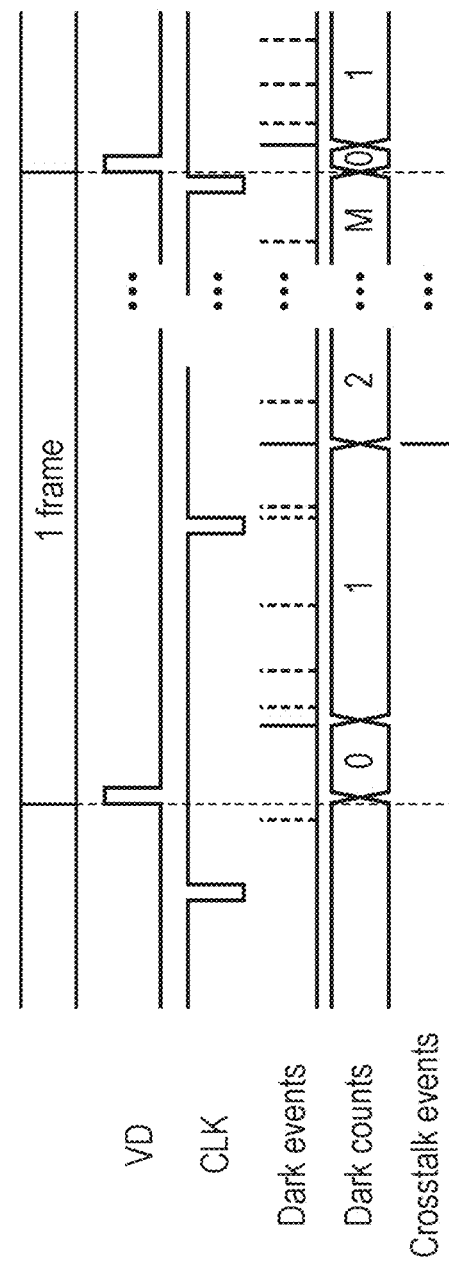

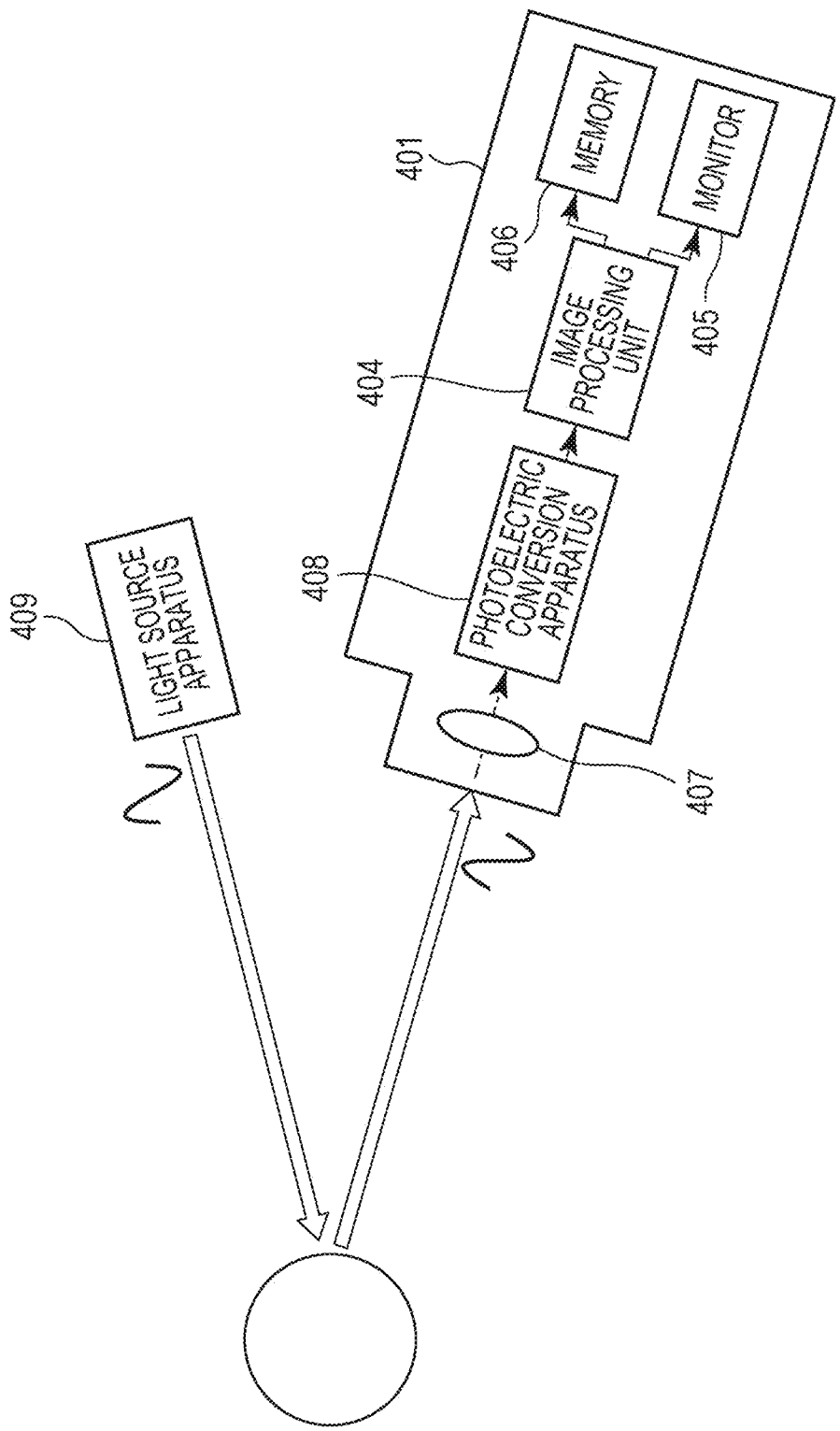

PHOTOELECTRIC CONVERSION APPARATUS AND PHOTODETECTION SYSTEM

BACKGROUND

Field of the Disclosure

The present disclosure relates to a photoelectric conversion apparatus configured to perform photoelectric conversion, and a photodetection system.

Description of the Related Art

A photoelectric conversion apparatus is known which includes a pixel array formed such that pixels each including an avalanche photodiode (APD) are arranged in a plane in the form of a two-dimensional array. In each pixel, in a PN junction region in a semiconductor region, a photocharge originating from a single photon is multiplied by an avalanche multiplication process.

Japanese Patent Laid-Open No. 2020-123847 discloses techniques related to a pixel including an APD, the APD, a quench circuit connected to the APD, a signal control circuit to which a signal output from the APD is input, and a pulse generation circuit connected to the quench circuit and the signal control circuit. The pulse generation circuit controls a turning-on/off operation of the quench circuit. It is also disclosed that the potential of the output node of the APD is reset, and a pulse signal corresponding to an input photon is output even in a high luminance condition.

SUMMARY OF THE DISCLOSURE

In an aspect, the present disclosure provides an apparatus including a photodiode including an anode and a cathode, a switch connected to a node of one of the anode and the cathode and to a power supply line via which a driving voltage is supplied, and functioning to switch a resistance value between the node and the power supply line, and a generation unit configured to generate a pulse signal for controlling switching of the switch, the apparatus being operable in one of two modes including a first mode and a second mode, the second mode being usable in a lower luminance condition than a luminance condition in the first mode, in an exposure period for acquiring one frame of signals, the number of pulse signals in the second mode being smaller than in the first mode.

Further features of the disclosure will become apparent from the following description of exemplary embodiments with reference to the attached drawings.

BRIEF DESCRIPTION OF THE DRAWINGS

FIGS. 10A and 10B are timing charts related to control pulses in a photoelectric conversion apparatus in a first mode and a second mode, respectively, according to a first embodiment.

FIG. 17 is a block diagram of a photodetection system according to a fifth embodiment.

DESCRIPTION OF THE EMBODIMENTS

Figure 1:
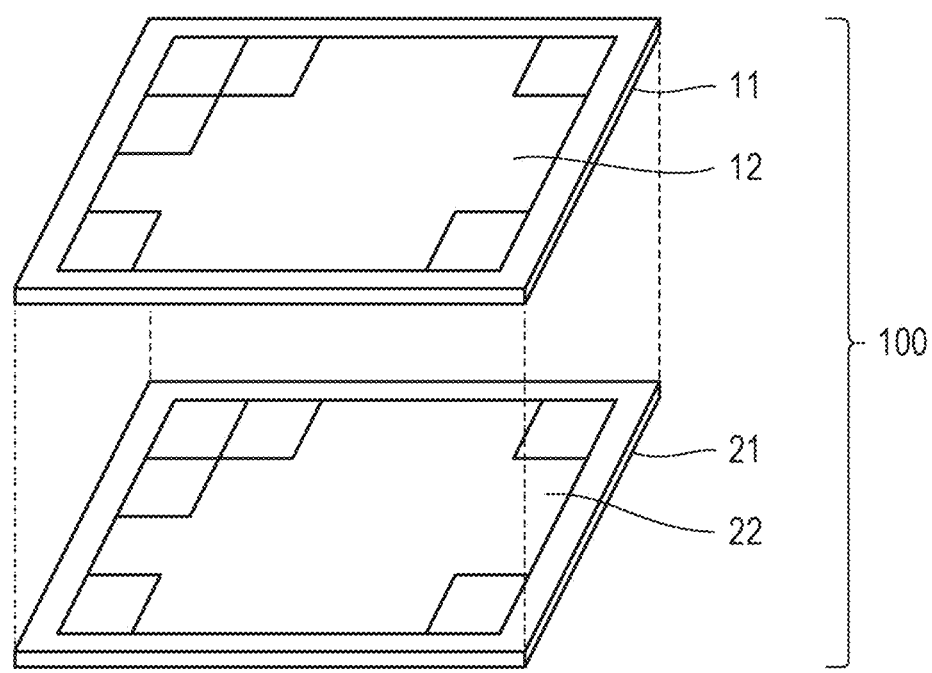
FIG. 1 is a diagram illustrating a configuration of a photoelectric conversion apparatus.

Embodiments are described below for illustrating technical ideas of the present disclosure and not for limiting the present disclosure to these embodiments. In some diagrams, sizes and positional relationships of elements may be exaggerated for the sake of clarity. In the following description, similar elements/configurations will be denoted by similar reference numerals, and duplicated descriptions thereof may be omitted.

A common configuration of photoelectric conversion apparatuses according to the embodiments is described below with reference to FIGS. 1 to 4.

The photoelectric conversion apparatus includes a SPAD pixel including an avalanche diode. Of charge pairs generated in the avalanche diode, the conductivity type of charges used as signal charges is called a first conductivity type. That is, the first conductivity type refers to a conductivity type of charges of majority carriers with the same polarity as that of the signal charge. The conductivity type opposite to the first conductivity type is referred to as a second conductivity type. In the following description, by way of example, the signal charges are given by electrons, the first conductive type is N type, and the second conductivity type is P type. However, the signal charges may be given by holes, the first conductivity type may be P type, and the second conductivity type may be N type.

In a case where the signal charges are given by electrons, a signal is read from a cathode of the APD. However, in a case where the signal charges are given by holes, a signal is read from an anode of the APD. Therefore, functions of the cathode and the anode of the APD become reversed.

In the present description, an expression of "when seen in plan view" is used to describe a manner in which a structure of interest is seen in a direction perpendicular to a light incidence plane of a semiconductor layer in which a photoelectric conversion element described later is disposed. Furthermore, a "cross section" refers to a plane perpendicular to the light incidence plane of the semiconductor layer in which the photoelectric conversion element is disposed. When a light incident surface of a semiconductor layer is a rough surface when viewed microscopically, a plan view is defined with a reference to a macroscopic light incident surface of the semiconductor layer.

First, a configuration common to the embodiments is described.

FIG. 1 is a diagram illustrating a configuration of a photoelectric conversion apparatus 100 according to an embodiment of the present disclosure. In the following description, it is assumed by way of example that the photoelectric conversion apparatus 100 is of a multilayer type. That is, in the photoelectric conversion apparatus 100 taken as an example in the following description, two substrates, that is, a sensor substrate 11 and a circuit substrate 21, are put together in a multilayer structure and an electrically connection is made between them. However, the photoelectric conversion apparatus is not limited to this example. For example, the photoelectric conversion apparatus may be a photoelectric conversion apparatus configured such that elements of the sensor substrate 11 and elements of a circuit substrate are disposed in a common semiconductor layer, as will be described later. Hereinafter, when a photoelectric conversion apparatus is configured such that elements of the sensor substrate 11 and elements of a circuit substrate are disposed in a common semiconductor layer, this type of photoelectric conversion apparatus is referred to as a non-multilayer photoelectric conversion apparatus.

The sensor substrate 11 includes a first semiconductor layer including a photoelectric conversion element 102 described later, and a first wiring structure. The circuit substrate 21 includes a second semiconductor layer including a circuit such as a signal processing circuit 103 described later, and a second wiring structure. In the photoelectric conversion apparatus 100, the second semiconductor layer, the second wiring structure, the first wiring structure, and the first semiconductor layer are put one on another in this order to form the multilayer structure.

In the photoelectric conversion apparatus shown in FIG. 1, light is incident on a first surface and the circuit substrate is disposed on a second surface opposite to the first surface. This configuration is called a backside illumination type. In the non-multilayer photoelectric conversion apparatus, a surface on the side where transistors of a signal processing circuit are disposed is called the second surface. In the case of the backside illumination photoelectric conversion apparatus, the first surface of the semiconductor layer opposite to the second surface is the light incident surface. In the case of the backside illumination photoelectric conversion apparatus, the light incidence surface is given by the second surface of the semiconductor layer.

In the following, it is assumed by way of example but not limitation that the sensor substrate 11 and the circuit substrate 21 each are a diced chip. Alternatively, for example, each substrate may be a wafer. Furthermore, substrates may be placed one on another into a multilayer structure, and a resultant multilayer structure may be diced into chips, or chips may be constructed first and then the chips may be placed one on another into a multilayer structure.

A pixel area 12 is formed on the sensor substrate 11, while a circuit area 22 for processing a signal detected in the pixel area 12 is formed on the circuit substrate 21.

Figure 2:
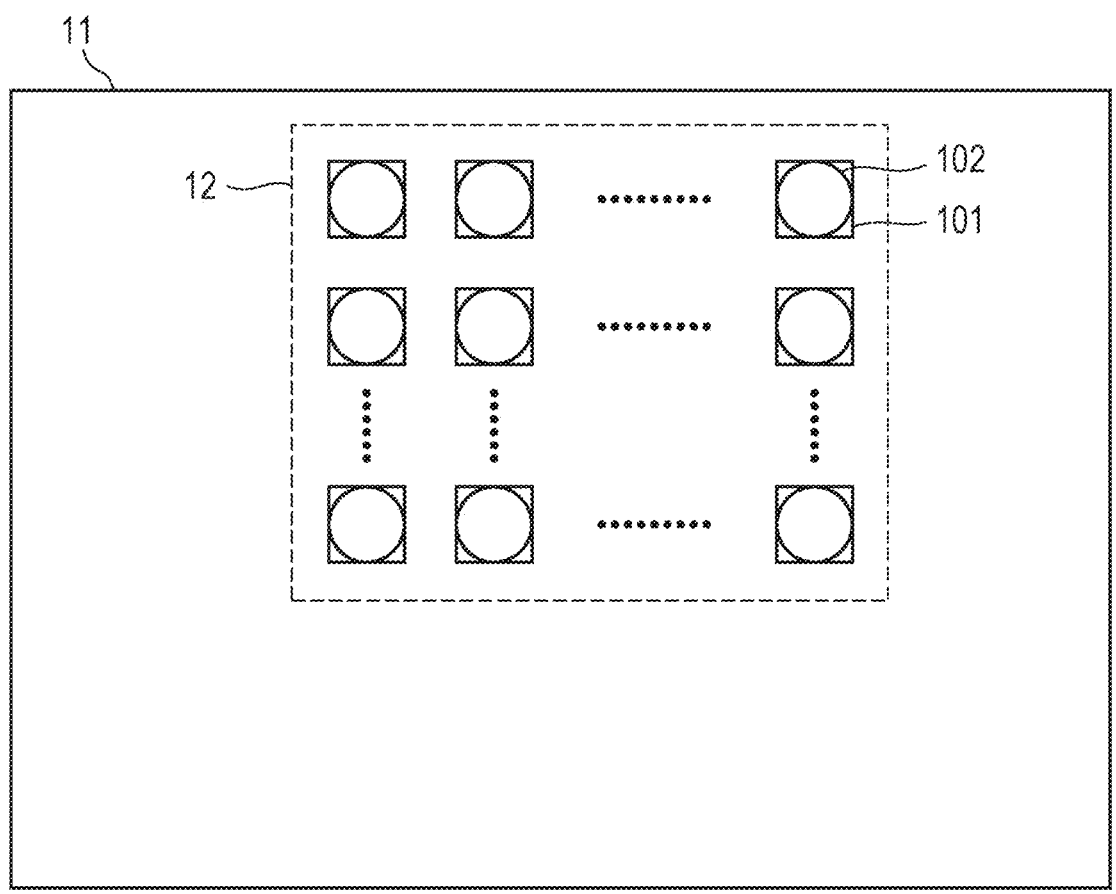
FIG. 2 is a diagram illustrating an example of a layout of a sensor substrate.

FIG. 2 is a diagram showing an example of a layout of the sensor substrate 11. In the pixel area 12, pixels 101 are arranged in a two-dimensional array as seen in a plan view where each pixel 101 includes a photoelectric conversion element 102 including an avalanche photodiode (hereinafter referred to as an APD).

The pixel 101 is typically a pixel for forming an image, but in the case of use for TOF (Time of Flight), the pixel 101 may not form an image. That is, the pixel 101 may be a pixel for measuring the time when light arrives and for measuring the amount of light.

Figure 3:
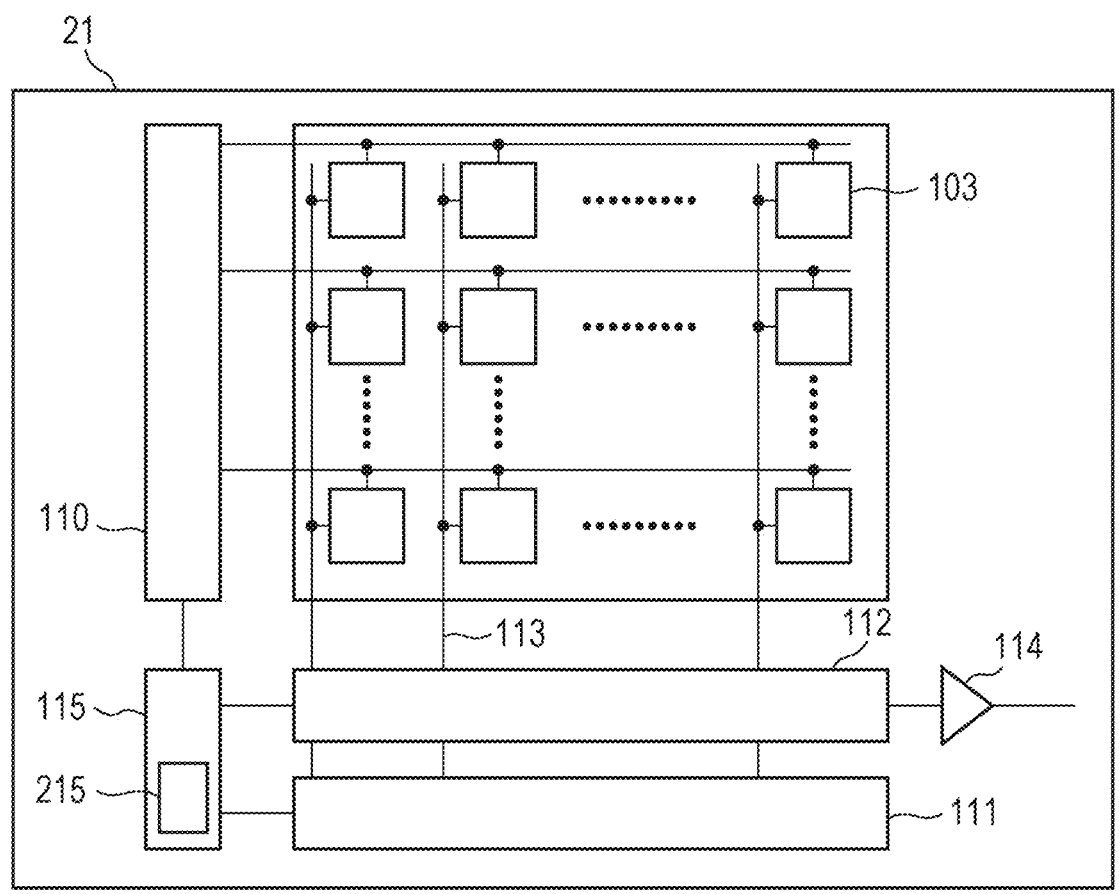
FIG. 3 is a diagram illustrating an example of a layout of a circuit substrate.

FIG. 3 is a diagram showing a configuration of the circuit substrate 21. The circuit substrate 21 includes a signal processing circuit 103 configured to process a charge generated via a photoelectric conversion performed by the photoelectric conversion element 102 shown in FIG. 2, a readout circuit 112, a control pulse generation unit 115, a horizontal scanning circuit unit 111, a signal line 113, and a vertical scanning circuit unit 110.

Each photoelectric conversion element 102 shown in FIG. 2 is electrically connected, via a connection wiring provided for each pixel, to corresponding one of the signal processing circuits 103 shown in FIG. 3.

The vertical scanning circuit unit 110 receives a control pulse supplied from the control pulse generation unit 115, and supplies a control pulse to each pixel. The vertical scanning circuit unit 110 is realized using a logic circuit such as a shift register, an address decoder, and/or the like.

The control pulse generation unit 115 includes a signal generation unit 215 that generates a control signal CLK for controlling a switch, as will be described later. The signal generation unit 215 generates the pulse signal of the control signal for controlling the switch such that at least one of the period of the pulse signal, the number of pulses, and the pulse width corresponds to the exposure period as described later. The control pulse generation unit 115 may include a frequency dividing circuit. This makes it possible to simplify the control, which allows a reduction in the number of elements.

The signal output from the photoelectric conversion element 102 of each pixel is processed by the corresponding one of the signal processing circuits 103.

Each signal processing circuit 103 includes a counter, a memory, etc., and a digital value is held in the memory.

The horizontal scanning circuit unit 111 supplies control pulses to the signal processing circuits 103 so as to sequentially select columns and read digital pixel signals from the memories of the pixels.

When a particular column is selected, a signal is output to the signal line 113 from a signal processing circuit 103 of a pixel selected by the vertical scanning circuit unit 110.

The signal output to the signal line 113 is output via the output circuit 114 to an external storage unit or signal processing unit outside the photoelectric conversion apparatus 100.

In FIG. 2, the arrangement of the photoelectric conversion elements in the pixel area may be one-dimensional. The function of the signal processing unit does not necessarily have to be provided separately for each of all photoelectric conversion elements. For example, one signal processing unit may be shared by a plurality of photoelectric conversion elements, and signal processing may be sequentially performed for these photoelectric conversion elements.

As shown in FIGS. 2 and 3, a plurality of signal processing circuits 103 are arranged in an area overlapping, in a plan view, the pixel area 12. Furthermore, in the plan view, between an edge of the sensor substrate 11 and an edge of the pixel area 12, the vertical scanning circuit unit 110, the horizontal scanning circuit unit 111, the readout circuit 112, the output circuit 114, and the control pulse generation unit 115 are disposed. In other words, the sensor substrate 11 has the pixel area 12 and a non-pixel area around the pixel area 12, and in an area overlapping, in the plan view, the non-pixel area, the vertical scanning circuit unit 110, the horizontal scanning circuit unit 111, the readout circuit 112, the output circuit 114, and the control pulse generation unit 115 are disposed.

The manner of disposing the signal line 113, the readout circuit 112, and the output circuit 114 is not limited to that shown in FIG. 3. For example, the signal line 113 may be disposed so as to extend in the row direction, and the readout circuit 112 may be disposed at a location toward which the signal line 113 extends.

Figure 4:
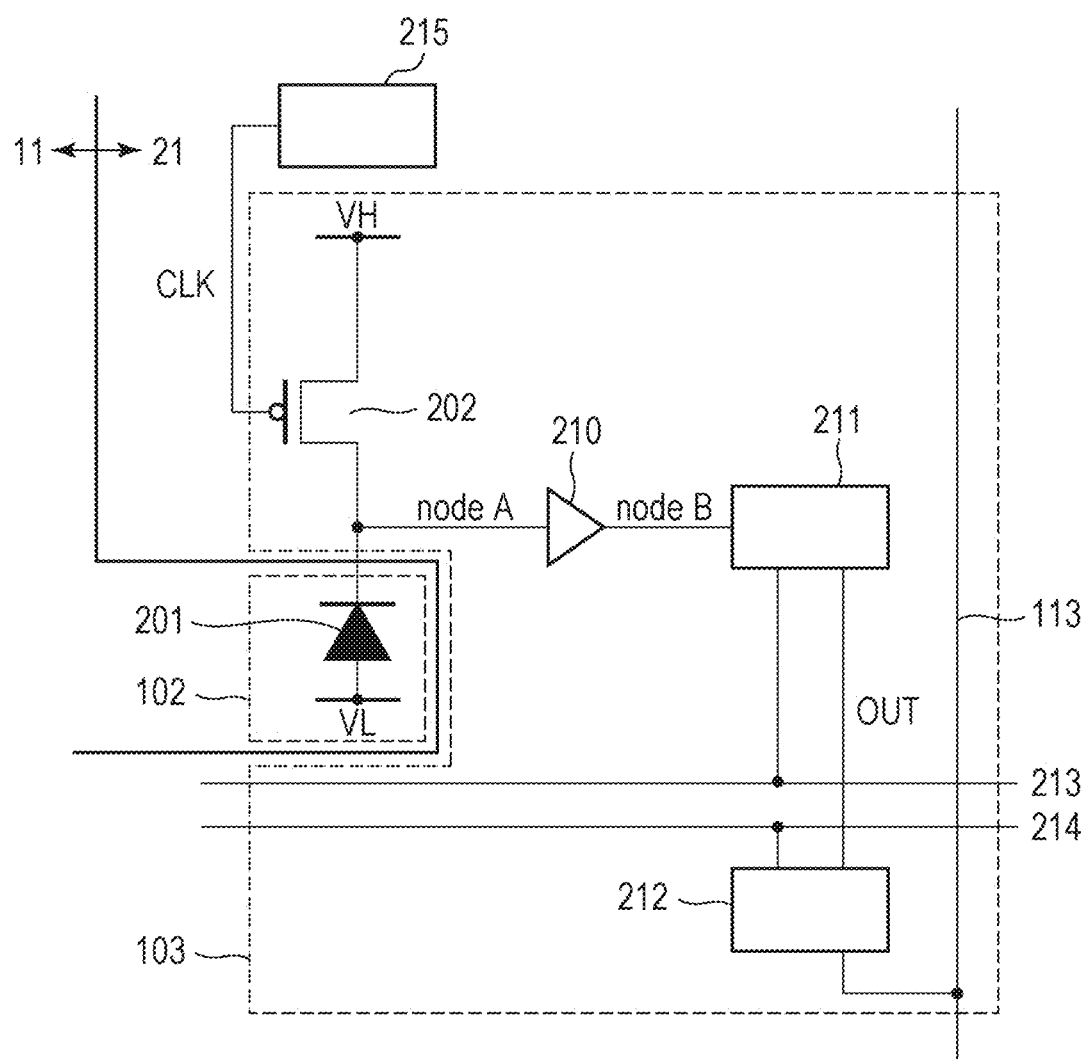
FIG. 4 is a block diagram including an equivalent circuit diagram of a photoelectric conversion element.

FIG. 4 is a block diagram including an equivalent circuit diagram illustrating an example of a detailed configuration of one of pixels shown in FIG. 2 or 3.

In FIG. 4, each photoelectric conversion element 102 including an APD 201 is disposed on the sensor substrate 11, while the other elements are disposed on the circuit substrate 21.

The APD 201 generates charge pairs in response to incident light via a photoelectric conversion process. One of two nodes of the APD 201 is connected to a power supply line via which a driving voltage VL (a first voltage) is supplied. The other one of the two nodes of the APD 201 is connected to a power supply line via which a driving voltage VH (a second voltage), higher than the voltage VL supplied to the anode, is supplied. In FIG. 4, one node of the APD 201 functions as an anode and the other node functions as a cathode. A reverse bias voltage is applied between the anode and the cathode of the APD 201 such that avalanche multiplication can occur in the APD 201. In a state in which the APD 201 is supplied with such a reverse bias voltage, when light is incident, a charge is generated by the incident light and is multiplicated via the avalanche multiplication process. As a result, an avalanche current is generated.

Depending on the magnitude of the reverse bias voltage, the APD can operate in either one of two modes: a Geiger mode in which a voltage greater than a breakdown voltage is applied between the anode and the cathode of the APD; and a linear mode in which the voltage applied between the anode and the cathode is close to or smaller than the breakdown voltage.

When the APD operates in the Geiger mode, the APD is called a SPAD. For example, the voltage VL (the first voltage) is −30 V and the voltage VH (the second voltage) is 1 V. The APD 201 may be operated in the linear mode or in the Geiger mode. In SPADs, a higher voltage is applied than a voltage used in APDs, and the breakdown provides a greater effect. From this point of view, it may be desirable to use the APD 201 as the SPAD.

In one embodiment, a switch 202 is connected between one of the nodes of the anode or the cathode of the APD 201 and the power line via which the driving voltage VH is supplied. The switch 202 switches the resistance between the APD 201 and the power supply line via which the driving voltage VH is supplied. In the switching of resistance, the resistance value is switched by a factor of 10 or greater, and even by a factor of 100 or greater. Hereinafter, when the resistance is switched to a lower resistance value, this switching is referred to as turning-on of the switch 202, while when the resistance is switched to a higher resistance value, this switching is referred to as turning-off of the switch 202. The switch 202 functions as a quench element. The switch 202 functions as a load circuit (a quenching circuit) when a signal is multiplied by the avalanche multiplication process such that the voltage applied to the APD 201 is suppressed thereby suppressing the avalanche multiplication (a quenching operation). In addition, the switch 202 also functions to return the voltage applied to the APD 201 to the driving voltage VH by passing a current corresponding to the voltage drop in the quench operation (a recharge operation).

The switch 202 may be realized using, for example, a MOS transistor. In the example shown in FIG. 4, a PMOS transistor is used as the switch 202. A control signal CLK generated by the signal generation unit 215 is supplied to the switch 202 such that it is applied to the gate electrode of the MOS transistor functioning as the switch 202. In the present embodiment, the switch 202 is turned on/off by controlling the voltage applied to the gate electrode of the switch 202.

The signal processing circuit 103 includes a waveform shaping unit 210, a counter circuit 211, and a selection circuit 212. Note that in the example shown in FIG. 4, the signal processing circuit 103 includes the waveform shaping unit 210, the counter circuit 211, and the selection circuit 212, but, in the present disclosure, the signal processing circuit 103 may include at least one of the waveform shaping unit 210, the counter circuit 211, and the selection circuit 212.

The waveform shaping unit 210 shapes the voltage change at the cathode of the APD 201 obtained in a photon detection operation, and outputs a resultant shaped signal as a pulse signal. The node on the input side of the waveform shaping unit 210 is denoted by a node A, and the node on the output side of the waveform shaping unit 210 is denoted by a node B. The waveform shaping unit 210 changes the voltage output from the node B depending on whether the input voltage to the node A is equal to or higher than a predetermined value or lower than the predetermined value. For example, in FIG. 5, when a voltage equal to or higher than a judgment threshold value is input to the node A, the output voltage at the node B is switched to a low level. However, when a voltage equal to or lower than the judgment threshold value is input to the node A, the output voltage at the node B is switched to a high level. As the waveform shaping unit 210, for example, an inverter circuit is used. Although in the example shown in FIG. 4, one inverter is used as the waveform shaping unit 210, a circuit including a plurality of inverters connected in series may be used, or another circuit having a waveform shaping function may be used.

The quench operation or the recharge operation using the switch 202 is performed depending on the state of the avalanche multiplication in the APD 201. However, there is a possibility that when a photon is actually incident, a signal is not output in response to the incidence of the photon. Such a possibility will be discussed in more detail below. Here, let it be assumed, for example, that the operation is in a situation in which an avalanche multiplication occurs in the APD and the avalanche multiplication has caused the voltage input to the node A to be transitioned to the low level, and the recharge operation is being performed.

In general, the judgment threshold value for use in judgment by the waveform shaping unit 210 is set to a voltage higher than a minimum voltage at which avalanche multiplication can occur in the APD. If a photon is incident when the voltage at the node A is, in the middle of the recharge operation, at a value which is lower than the judgment threshold value but which is higher than the minimum voltage at which avalanche multiplication can occur in the APD, then avalanche multiplication occurs in the APD and thus the voltage at the node A drops. Since this voltage drop at the node A occurs when the voltage at the node A is lower than the judgment threshold value, no change occurs in the output voltage at the node B although the incidence of the photon has occurred. Therefore, no signal indicating the incidence of the photon is output although the avalanche multiplication has occurred. In particular, under a high luminance condition, photons are incident continuously in a short period of time, which causes an increase in the probability that photon incidence occurs without being detected. As a result, the number of output signals tends to deviate from the actual number of incident photons, although many photons are incident in the high luminance condition.

Figure 5:
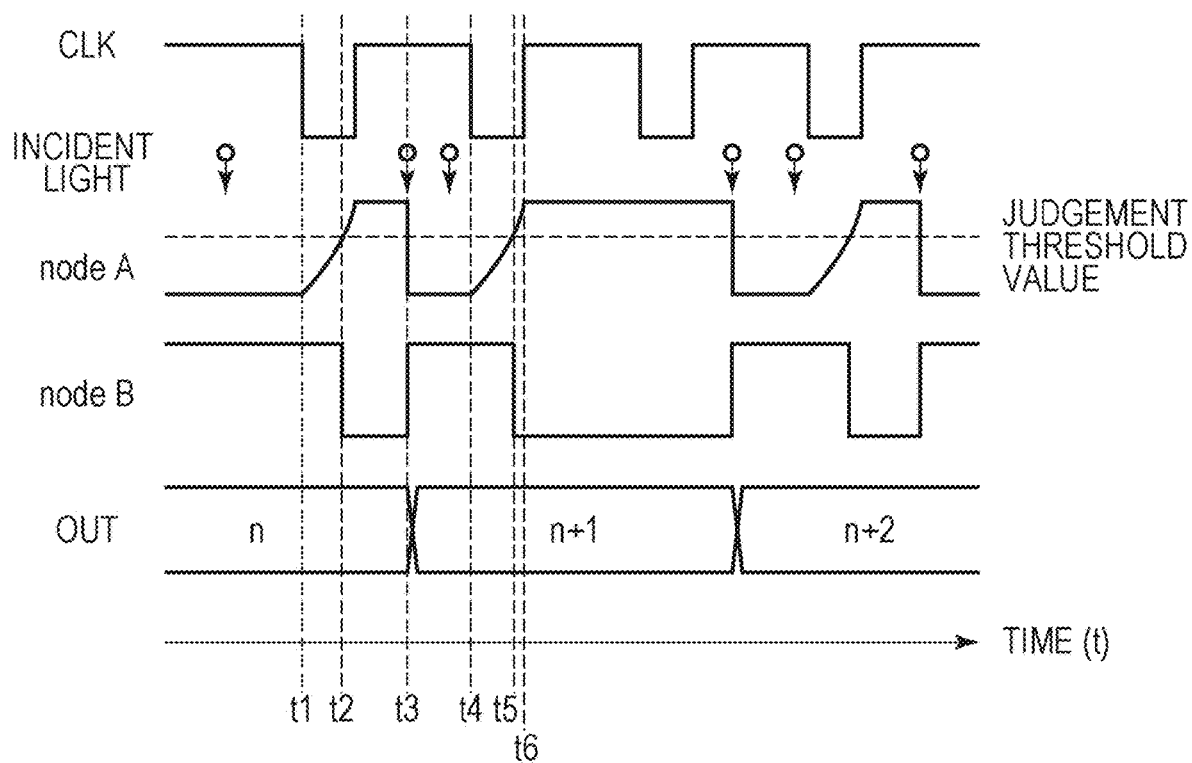
FIG. 5 is a timing chart related to an operation of driving a photoelectric conversion element.

To handle the above situation, the control signal CLK is applied to the switch 202 to turn on/off the switch 202 such that a signal is output correctly in response to incidence of a photon even when photons are continuously incident on the APD in a short time. Referring to FIG. 5, a signal detection operation is described below for a case, by way of example, in which a periodic pulse signal is used as the control signal CLK. In other words, in the example shown in FIG. 5, the switch 202 is turned on/off at a predetermined clock frequency. However, the effect of suppressing the failure of detecting incidence of photons can be obtained by using a signal other than a periodic pulse signal.

The counter circuit 211 counts the number of pulse signals output from the waveform shaping unit 210 and holds a count value. When a control pulse pRES is supplied via a drive line 213, the signal held in the counter circuit 211 is reset.

A control pulse pSEL is supplied to the selection circuit 212 from the vertical scanning circuit unit 110 shown in FIG. 3 via a drive line 214 shown in FIG. 4 (not shown in FIG. 3) thereby switching an electric connection state (a connected state or a non-connected state) between the counter circuit 211 and the signal line 113. The selection circuit 212 includes, for example, a buffer circuit for outputting a signal. An output signal OUT shown in FIG. 4 is a signal which is output from a pixel.

A transistor or the like functioning as a switch may be disposed between the switch 202 and the APD 201 or between the photoelectric conversion element 102 and the signal processing circuit 103 thereby switching the electrical connection. The supply of the voltage to the photoelectric conversion element 102 may be electrically switched between the voltage VH and the voltage VL by using a transistor or the like functioning as a switch.

In the configuration according to the present embodiment, by way of example, the counter circuit 211 is used. However, in the photoelectric conversion apparatus 100, instead of the counter circuit 211, a time-to-digital converter (TDC) and a memory may be used to acquire a pulse detection timing. In this case, the time at which the pulse signal is generated and output from the waveform shaping unit 210 is converted into a digital signal by the TDC. To make it possible for the TDC to measure the time at which the pulse signal is generated, a control pulse pREF (a reference signal) is supplied via a drive line to the TDC from the vertical scanning circuit unit 110 shown in FIG. 1. The TDC detects the time at which a signal is output from each pixel via the waveform shaping unit 210 with reference to the control pulse pREF, and acquires a digital signal indicating the detected time.

FIG. 5 is a diagram schematically showing the relationship among the switch control signal CLK, the voltage at the node A, the voltage at the node B, and the output signal. In the present embodiment, when the control signal CLK is at the high level, the driving voltage VH is not supplied to the APD, while when the control signal CLK is at the low level, the driving voltage VH is supplied to the APD. The high-level voltage of the control signal CLK is, for example, 1 V, and the low-level voltage of the control signal CLK is, for example, 0 V. When the control signal CLK is at the high level, the switch is in the off-state, while when the control signal CLK is at the low level, the switch is in the on-state. When the control signal CLK is at the high level, the resistance of the switch is higher than when the control signal CLK is at the low level. When the control signal CLK is at the high level, recharging does not easily occur even when the avalanche multiplication occurs in the APD, and thus the voltage supplied to the APD becomes equal to or lower than the breakdown voltage. As a result, the avalanche multiplication operation in the APD stops.

As shown in FIG. 4, the switch 202 may be realized using one transistor, and the quench operation and the recharge operation may be performed by this one transistor. This makes it possible to reduce the number of circuit elements compared to the case where the quench operation and the recharge operation are performed by different circuit elements. In particular, in a case where each pixel has its own counter circuit and a SPAD signal is read out in each pixel, in order to create a space for disposing the counter circuit, the circuit area for disposing the switch may be minimized. For this purpose, it is very effective to configure the switch 202 using one transistor.

At time t1, the control signal CLK changes from the high level to the low level, and thus the switch turns on, and the recharge operation of the APD is started. As a result, the voltage of the cathode of the APD transitions to the high level, and a voltage applied between the anode and the cathode of the APD becomes sufficiently large for avalanche multiplication to occur in the APD 201. The voltage of the cathode is the same as that of the node A. Therefore, when the cathode voltage transitions from the low level to the high level, the voltage of the node A becomes equal to or higher than the judgment threshold value at time t2. At this time, the pulse signal output from the node B is inverted, that is, the voltage at the node B transitions from the high level to the low level. Thus, a voltage equal to the driving voltage VH minus the driving voltage VL is applied to the APD 201. The control signal CLK transitions to the high level, and the switch turns off.

Thereafter, when a photon is incident on the APD 201 at time t3, avalanche multiplication operation occurs in the APD 201, and thus an avalanche multiplication current flows through the switch 202 and the cathode voltage drops. That is, the voltage at the node A drops. When the voltage further drops and the voltage difference applied to the APD 201 becomes smaller, avalanche multiplication in the APD 201 stops as at time t2, and the voltage level of node A does not drop beyond a certain level.

In the course of the voltage drop of the node A, when the voltage of the node A becomes lower than the judgment threshold value, the voltage of node B transitions from the low level to the high level. That is, when the voltage at the node A drops below the judgment threshold value, the waveform is shaped by the waveform shaping unit 210 and a signal is output from the node B. This signal is counted by the counter circuit, and the count value of the counter signal output from the counter circuit is incremented by 1 LSB.

A photon is incident on the APD between time t3 and time t4, but the switch is in the off-state and the voltage applied to the APD 201 is smaller than the minimum value that allows avalanche multiplication to occur, and thus the voltage level of the node A does not exceed the judgment threshold value.

At time t4, the control signal CLK changes from the high level to the low level, and thus the switch turns on. As a result, a current flows from the driving voltage VH into the node A such that the voltage drop is compensated for, and the voltage at the node A transitions to the original high level. In the course of the transition to the high level, the voltage at the node A becomes equal to or higher than the judgment threshold value at time t5, and thus the pulse signal output at the node B is inverted, that is, the voltage at the node B changes from the high level to the low level.

At time t6, the voltage at the node A settles at the original high voltage level, and the control signal CLK transitions from the low level to the high level. As a result, the switch turns off. Thereafter, the voltages at the respective nodes and the signal lines and the like change according to the control signal CLK and in response to incidence of photons in a similar manner to the operation from time t1 to time t6 described above.

Various embodiments for the photoelectric conversion apparatus are described below.

First Embodiment

Figure 6A:
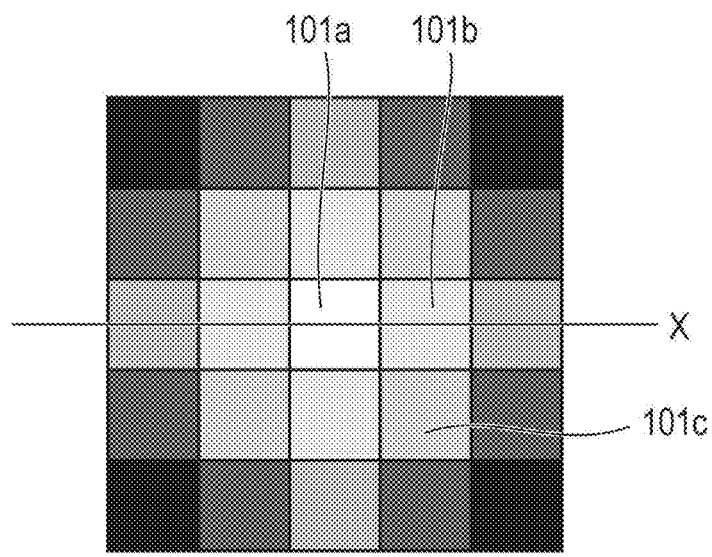
FIGS. 6A and 6B are each a diagram showing an output distribution influenced by crosstalk among pixels.
Figure 6B:
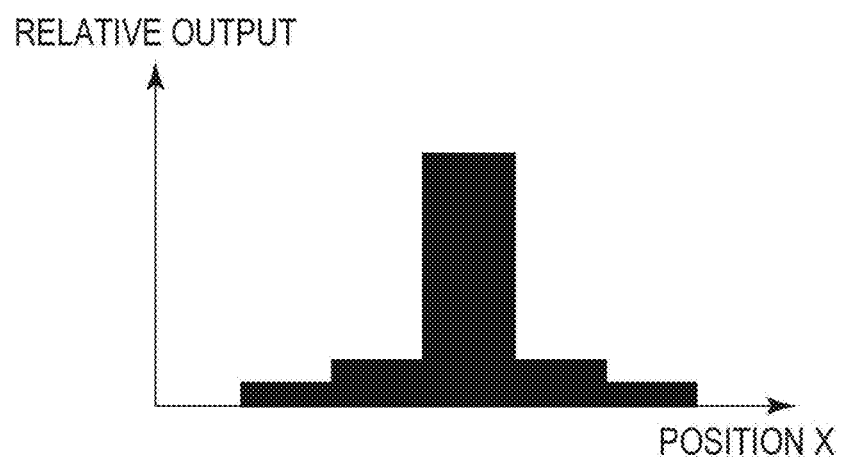

First, crosstalk between pixels is described with reference to FIGS. 6A and 6B. FIG. 6A is a diagram showing a distribution of outputs of 5×5 pixels in the pixel area, and FIG. 6B shows relative output values taken along a line X in FIG. 6A. A pixel 101a is a defective pixel. As shown in FIGS. 6A and 6B, when there is a defective pixel in the pixel area, an increase occurs in output levels of pixels 101b and 101c located neighboring the defective pixel 101a regardless of the illuminance of incident light. A possible reason for this is that avalanche light emission in the pixel 101a can cause generation of a charge to occur in neighboring pixels, and the generated charges in the neighboring pixels are subjected to avalanche multiplication. That is, the defect of the pixel 101a creates a situation in which avalanche light emission can easily occur, which causes a cluster of defects to occur, and thus an increase occurs in the relative output levels of the pixels neighboring the pixel 101a. This can result in degradation in the quality of an obtained image.

Comparative embodiments are described with reference to FIGS. 7A and 7B, FIGS. 8A and 8B, and FIGS. 9A to 9D, and then a first embodiment is described with reference to FIGS. 10A and 10B, FIGS. 11A and 1B, and FIGS. 12A to 12D.

When the defective pixel 101a exists in the pixel area as described above, if the control signal CLK is applied to the switch at a constant frequency regardless of an imaging mode, a conspicuous degradation in the quality of the obtained image may occur depending on the imaging mode of the photoelectric conversion apparatus.

Figure 7A:
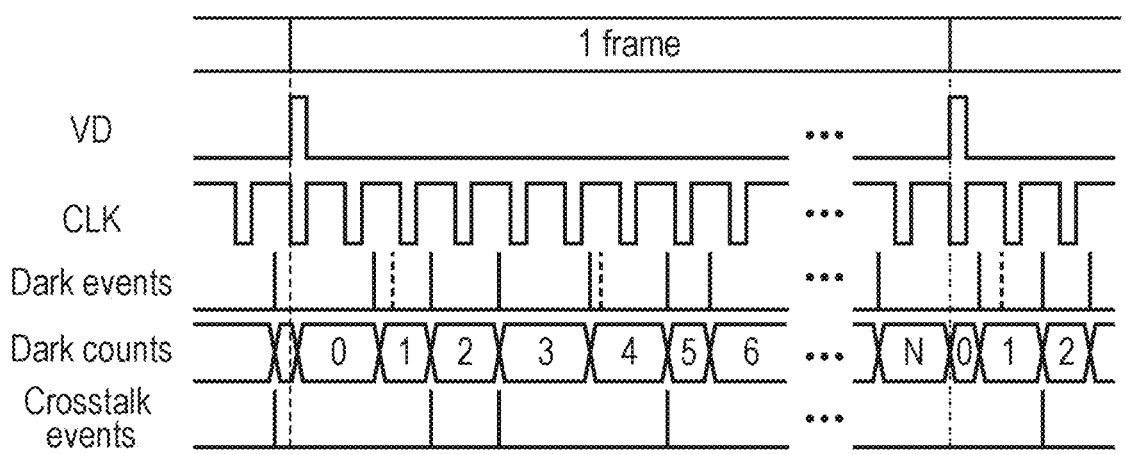
FIGS. 7A and 7B are timing charts related to control pulses in a photoelectric conversion apparatus in a first mode and a second mode, respectively, according to a comparative embodiment.
Figure 7B:
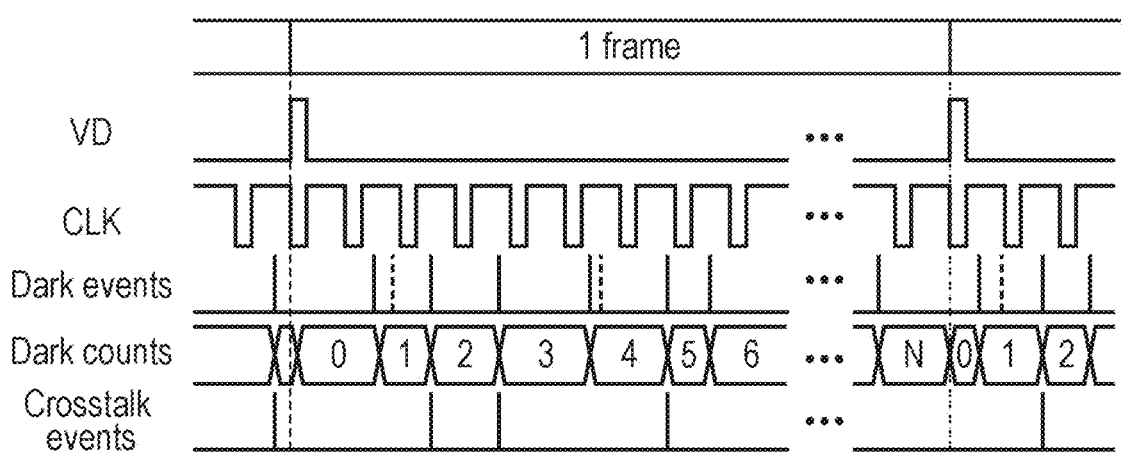

FIG. 7A is a diagram showing a timing chart related to a control signal and an avalanche light emission in the pixel 101a in one frame period in a high-luminance imaging process in a comparative embodiment. FIG. 7B is a diagram showing a timing chart related to a control signal and an avalanche light emission in the pixel 101a in one frame period in a low-luminance imaging process in the comparative embodiment. In this comparative embodiment, the control signal CLK is constantly supplied at a fixed frequency to the switch regardless of whether the imaging is performed in the low-luminance condition or the high-luminance condition. Hereinafter, the high-luminance imaging mode is also referred to as a first mode, and the low-luminance imaging mode is also referred to as a second mode.

The one frame period refers to, for example, a period from the rise of the pulse signal VD to the rise of the next pulse signal VD. Note that the one frame period is a period in which the vertical scanning circuit unit 110 scans pixel rows from a first pixel row to a last pixel row in the pixel area.

That is, one frame period is a period from an occurrence of a transition of the pulse signal VD, which is a vertical synchronization signal, to the high level once to a next occurrence of a transition to the high level. Note that it is not necessary to scan all pixel rows from the first pixel row to the last pixel row in the one frame period. For example, scanning of part of rows may be skipped in the course of scanning from the first row the last row in the one frame period. For example, when the pixel area includes rows from the first row to the n-th row, the scanning may be performed for the rows from the 2nd row to the (n−1)th row. In this case, one frame period is given by a period from the start of scanning the 2nd row to the end of scanning the (n−1)th row. A next one frame period starts when the 2nd row is scanned for the next time and ends when scanning of the (n−1)th row is completed.

In a case where some rows are skipped in a scanning process and then the skipped rows are scanned in an immediately following scanning process, one frame period may be given by a period which ends when scanning of the skipped rows are completed.

In each frame period, the count value of the counter circuit of the signal processing circuit may be reset. The timing of resetting the count value may be common to all pixels, or the resetting may be sequentially performed for each pixel row.

In the present embodiment, an exposure period refers to, for example, a period for acquiring signals for one frame. In the case of a camera using photoelectric conversion elements, the exposure period refers to a period during which the camera is in a state in which light can be incident on the APD 201, and the APD and the signal processing circuit can read the signal. Here, the state in which light can be incident refers to a state in which light is not blocked by a mechanical or electrical shutter or the like. The period during which the APD and the signal processing circuit can read the signal refers to a period during which the APD and the signal processing circuit are not intentionally turned off. Note that in this specification, the period in which the APD is subjected to the quenching operation is not a period in which the APD or the signal processing circuit is intentionally turned off, and is included in the signal readable period. The non-exposure period refers to a period during which the APDs 201 in the pixel area are shielded from light such that no light is incident. An example is a period during which the shutter is closed. The exposure period and the non-exposure period are not limited to be defined by whether shutter is open or closed, but may be defined by whether the bias applied to the APD 201 is adjusted such that photon signals can or cannot be acquired.

The control signal CLK is a signal that controls the turning-on/off of the switch 202 described above with reference to FIGS. 4 and 5.

In FIG. 7, dark events each indicate timing of generation of photons caused by avalanche light emission at the pixel 101*a* in FIG. 6. The rising timing of each dark event indicates a photon generation timing. Both solid lines and broken lines indicate photon generation timings, but the photons generated at the broken lines are not detected as photon signals and not counted. This is because, as described above, the voltage at the node A drops down before the voltage at the node A becomes equal to or higher than the judgment threshold value in response to photon generation, and thus the photon generation is not detected.

Dark counts indicate the counting operation of the counter circuit included in the pixel 101*a*. The recharging of the APD is performed when the voltage of the control signal CLK is at the low level. Therefore, in a case where after the recharge operation is performed, a photon is incident and is subjected to avalanche multiplication in the APD, a signal indicating the incidence of the photon is obtained and the count number of the counter circuit is incremented by one.

Crosstalk events each indicate a timing of an occurrence of crosstalk in pixels neighboring the pixel 101*a*. Since crosstalk occurs randomly, crosstalk shown in FIGS. 7A and 7B are merely examples.

There is substantially no difference in the number of occurrences of charge generation caused by avalanche light emission, etc. between the first mode and the second mode, and the charge generation caused by avalanche light emission occurs with a certain probability.

Figure 8A:
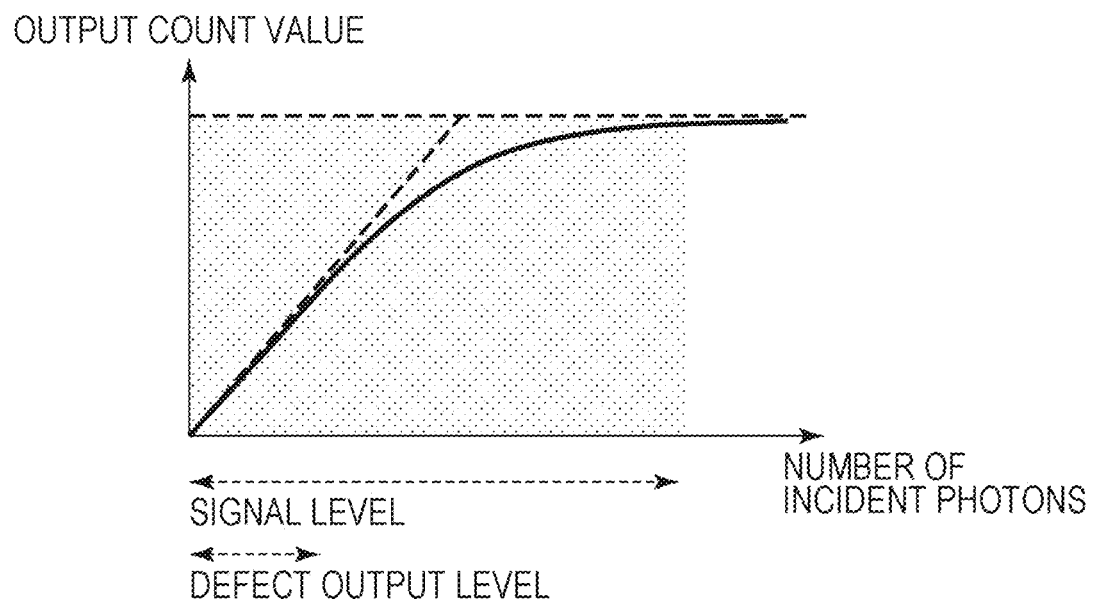
FIGS. 8A and 8B are diagrams representing output count values of the photoelectric conversion apparatus in the first mode and in the second mode, respectively, according to the comparative embodiment.
Figure 8B:
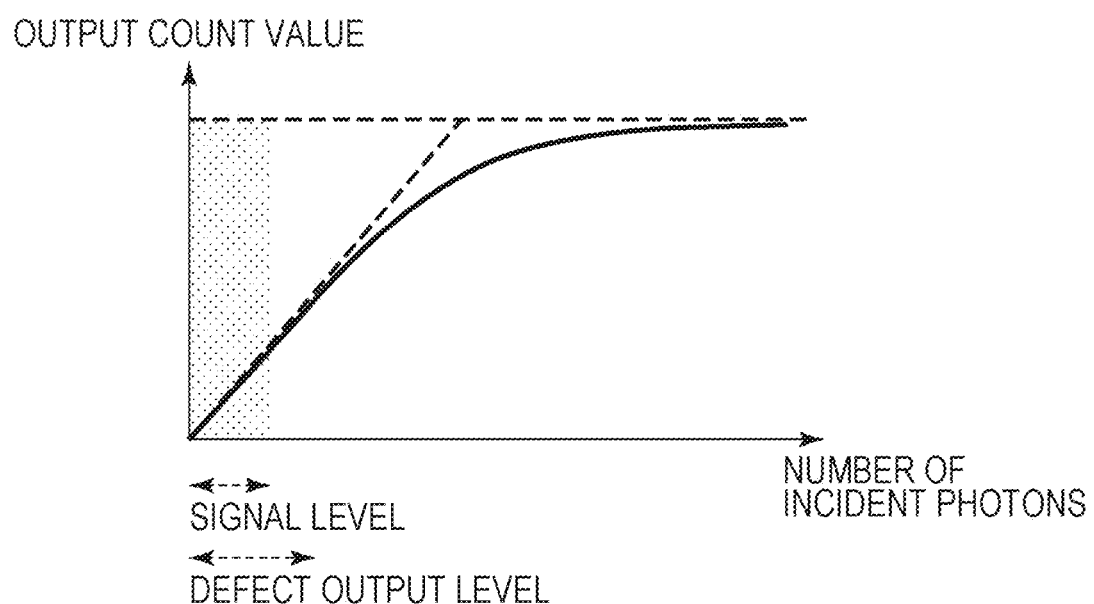

FIG. 8A shows a relationship between the number of incident photons per pixel and the value of output counts in the first mode shown in FIG. 7A. FIG. 8B shows a relationship between the number of incident photons per pixel and the value of output counts in the second mode shown in FIG. 7B.

As shown in FIG. 8A, in the first mode, the defect output level is lower than the signal level. In contrast, in the second mode, as shown in FIG. 8B, there is a possibility that the defect output level is higher than the signal level.

Figure 9A:
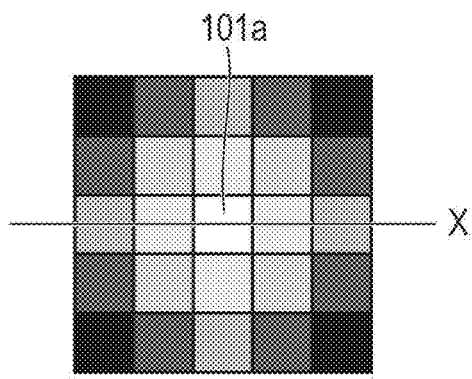
FIGS. 9A to 9D are diagrams each showing an output distribution influenced by crosstalk among pixels according to the comparative embodiment.
Figure 9B:
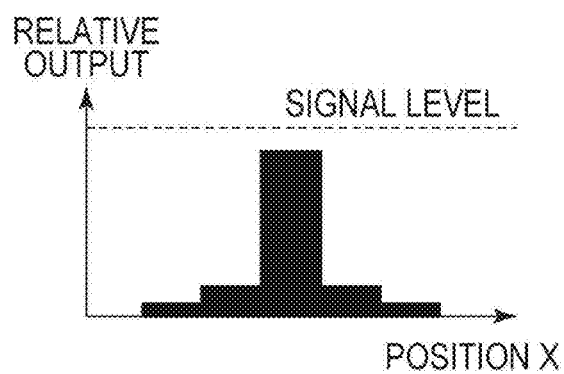
Figure 9C:
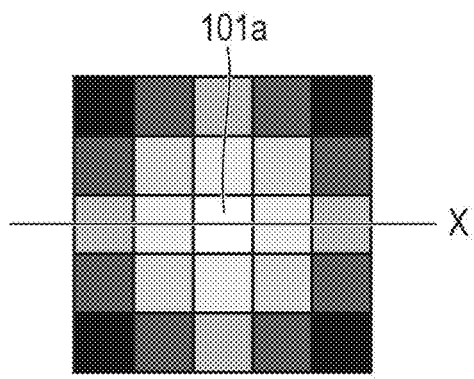
Figure 9D:
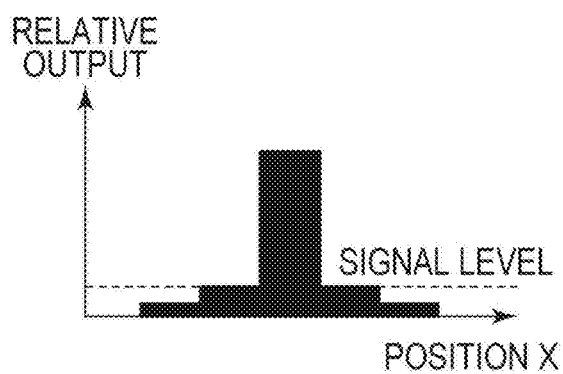

FIG. 9A is a diagram showing a distribution of outputs of pixels including the pixel 101*a* and 5×5 pixels around the pixel 101*a* in the first mode, and FIG. 9B shows relative output values taken along a line X in FIG. 9A. FIG. 9C is a diagram showing a distribution of outputs of pixels including the pixel 101*a* and 5×5 pixels around the pixel 101*a* in the second mode, and FIG. 9D shows relative output values taken along a line X in FIG. 9C. FIGS. 9B and 9D show signal levels that occur when imaging is performed. In the first mode, the relative output value of the signal level is higher than the relative output value of the pixel 101*a*, and thus an abnormal output of the pixel 101*a* due to a defect such as a scratch is not noticeable. In contrast, in the second mode, the relative output value of the signal level is lower than the relative output value of the pixel 101*a*, and thus an abnormal output of the pixel 101*a* is noticeable. Therefore, in the second mode, a signal generated by crosstalk makes it difficult to correctly detect a signal corresponding to a photon incident on a pixel in real time.

To handle the above situation, in the present embodiment, the influence of the pixel 101*a* is reduced by controlling the timing of the control signal CLK in the second mode. In the following description, duplicated descriptions of similar units/configurations to those of comparative embodiments may be omitted.

FIG. 10A is a diagram showing a timing chart related to a control signal and an avalanche light emission in the pixel 101*a* in one frame period in the first mode according to the first embodiment. FIG. 10B is a diagram showing a timing chart related to a control signal and an avalanche light emission in the pixel 101*a* in one frame period in the second mode according to the first embodiment.

In the first embodiment, the number of pulse signals functioning as the control signal CLK in one frame period in the second mode is smaller than the number of pulse signals functioning as the control signal CLK in one frame period in the first mode.

According to the first embodiment, the output signal in the second mode is less sensitive to an abnormal output of the pixel 101*a* as compared with the comparative embodiment, and thus it is possible to suppress the degradation in the image quality.

In one embodiment, for example, the number of control signals CLK per unit time in the second mode is set to be equal to or less than one-half that in the first mode. In another embodiment, for example, the number of control signals CLK per unit time in the second mode is set to be equal to or less than $\frac{1}{100}$ times that in the first mode.

In one embodiment, the number of control signals CLK in the second mode is equal to or less than 500, or equal to or less than 100.

Figure 11A:
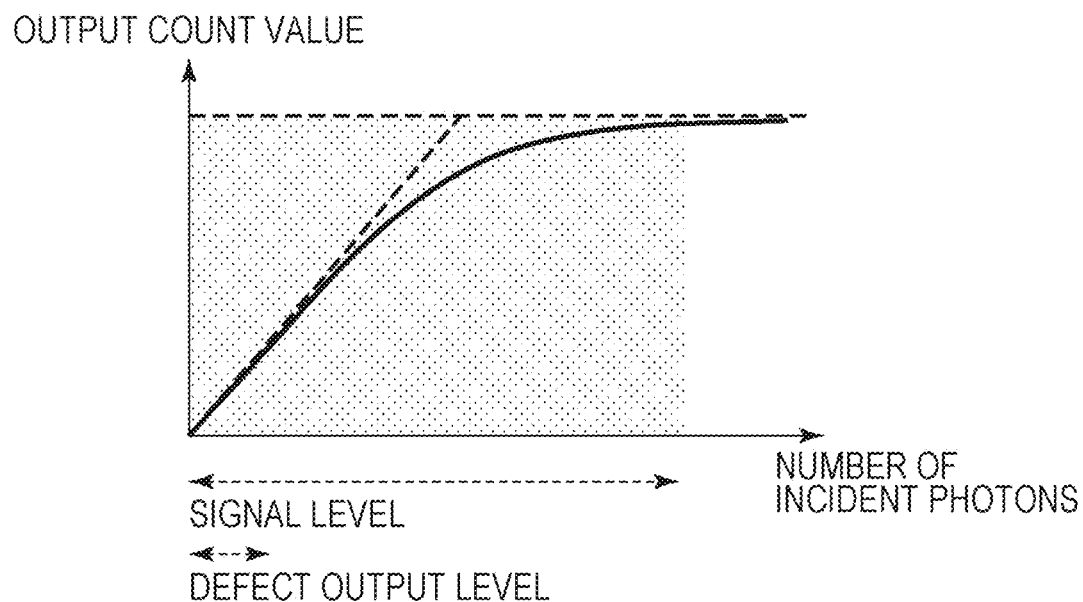
FIGS. 11A and 11B are diagrams representing output count values of the photoelectric conversion apparatus in the first mode and in the second mode, respectively, according to the first embodiment.
Figure 11B:
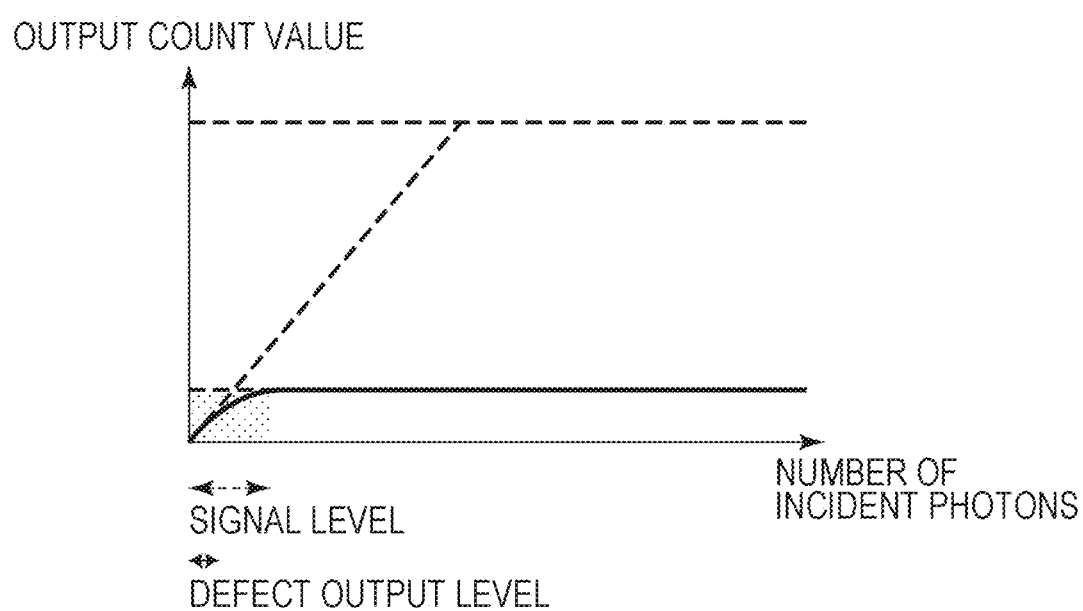

FIG. 11A shows a relationship between the number of incident photons per pixel and the value of output counts in the first mode shown in FIG. 10A. FIG. 11B shows a relationship between the number of incident photons per pixel and the value of output counts in the second mode shown in FIG. 10B.

According to the present embodiment, as shown in FIG. 11B, the defect output level in the second mode can be lower than the signal level. Therefore, it is possible to reduce the crosstalk from the pixel 101*a* in reading the signal, which makes it possible to reduce the degradation in the image quality as compared with the comparative embodiment.

In the second mode, the number of pulse signals in the exposure period in the frame period is smaller than the maximum count value of the counter circuit. The number of output counts in the second mode is smaller than in the first mode. However, when imaging is performed in a low luminance condition, the number of incident photons is small, and thus the reduction in the number of output counts does not cause a problem in counting the number of incidence photons.

Images captured in the second mode may be corrected by applying a digital gain.

Figure 12A:
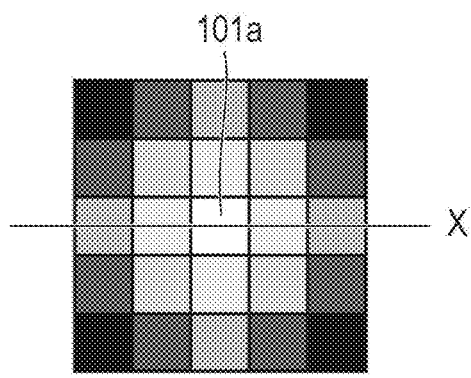
FIGS. 12A to 12D are diagrams each showing an output distribution influenced by crosstalk among pixels according to the first embodiment.
Figure 12C:
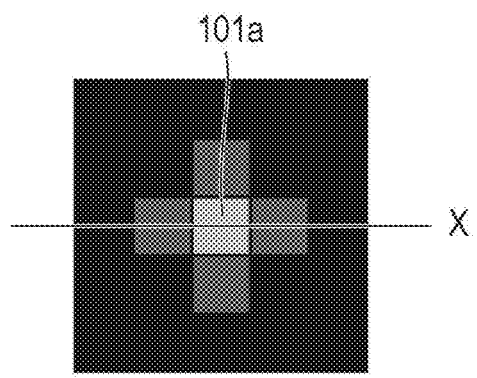
Figure 12B:
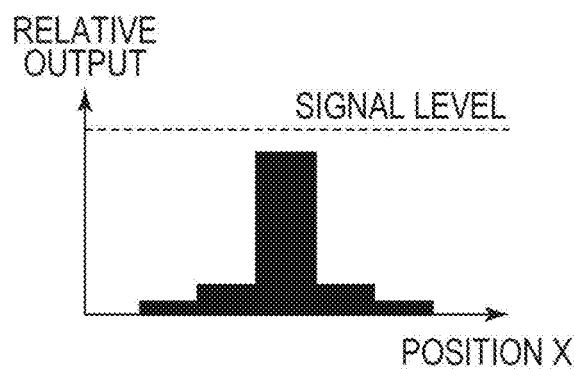

FIG. 12A is a diagram showing a distribution of outputs of pixels including the pixel 101*a* and 5×5 pixels around the pixel 101*a* in the first mode, and FIG. 12B shows relative output values taken along a line X in FIG. 12A.

Figure 12D:
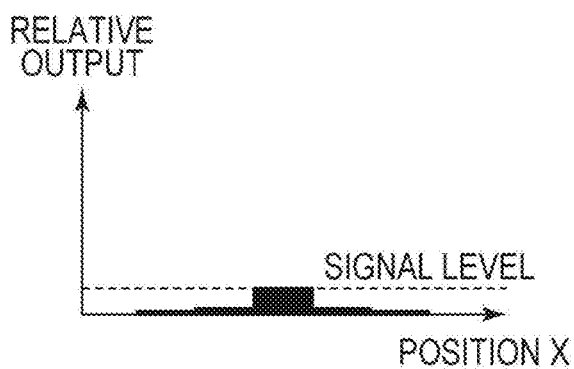

FIG. 12C is a diagram showing a distribution of outputs of pixels including the pixel 101*a* and 5×5 pixels around the pixel 101*a* in the second mode, and FIG. 12D shows relative output values taken along a line X in FIG. 12C. FIGS. 12B and 12D show signal levels that occur in the respective modes. As can be seen from FIG. 12C, according to the present embodiment, in the second mode, the relative output value of the pixel 101*a* is lower than that in the comparative embodiment. Therefore, in the second mode, a signal generated by crosstalk makes it difficult to correctly detect a signal corresponding to a photon incident on a pixel in real time.

Although there are two modes in FIG. 10 or elsewhere, a third mode may be provided as a mode in which an image is captured in a luminance condition different from those in the first mode and the second mode. Furthermore, four or more modes may be provided.

The exposure period in the second mode may be different from the exposure period in the first mode. For example, the exposure period in the first mode may be shorter than the exposure period in the second mode. Note that when the exposure period in the first mode is equal to that in the second mode, it is also possible to obtain the effects of the present embodiment.

In FIG. 10, the period and frequency of the control signal CLK are constant in each mode, but there may be a plurality of periods and frequencies of the control signal CLK. For example, one frame period may have a mixture of a plurality of values for the period of the control signal CLK from an occurrence of the low level to a next occurrence of the low level.

As described above, according to the present embodiment, it is possible to reduce the influence of noise on the signals output from the pixels in the second mode. As a result, it is possible to reduce the degradation in the quality of the image captured in the second mode as compared with the comparative embodiment.

Second Embodiment

Figure 13:
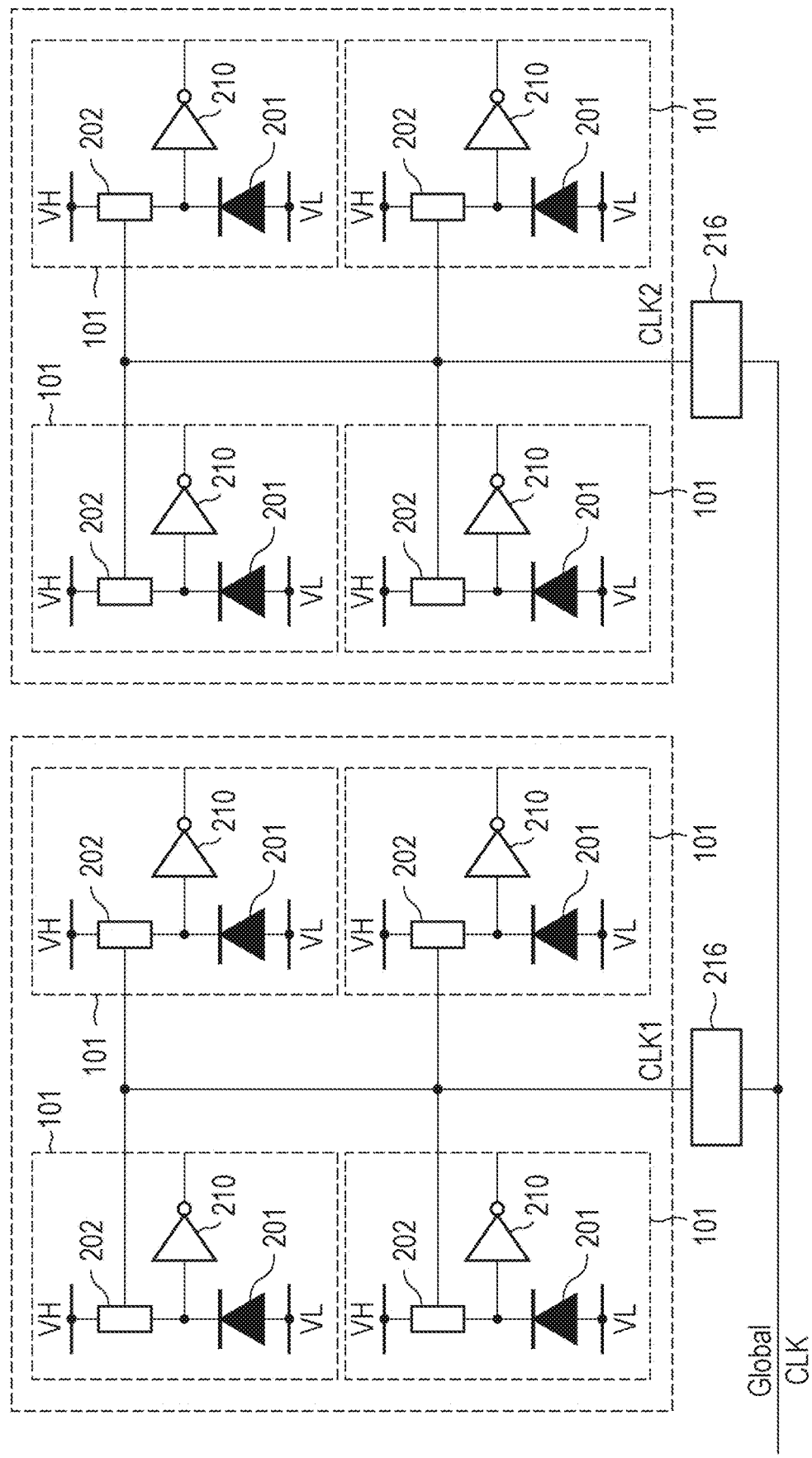
FIG. 13 is a block diagram of a photoelectric conversion apparatus according to a second embodiment.

FIG. 13 is a circuit block diagram of part of the pixels 101 in the pixel area according to a second embodiment. The second embodiment is different from the first embodiment in that a pattern of the pulse signal functioning as the control signal CLK is changed for each predetermined area of the pixel area. Except for the above point and the point described below, the second embodiment is substantially similar to the first embodiment, and thus similar elements to those in the first embodiment are denoted by similar reference numerals, and duplicated explanations thereof will be omitted.

A global clock (Global CLK) is output from the signal generation unit 215 as a common control signal and is supplied to control circuits 216a and 216b respectively disposed in particular areas. Each of the control circuits 216a and 216b is connected to switches 202 of pixels 101 in the corresponding one of the particular areas. According to an input control signal CLK1, the control circuit 216a controls driving of four pixels in the area.

According to an input control signal CLK2, the control circuit 216b controls driving of four pixels in the area.

The control signal CLK1 and the control signal CLK2 may be pulse signals having different patterns. For example, the number of pulses in one frame period may be larger for the control signal CLK2 than for the control signal CLK1. For example, the repetition period of the pulses in one frame period may be longer for the control signal CLK2 than for the control signal CLK1.

According to the present embodiment, as with the first embodiment, it is possible to reduce the influence of noise on the signals output from the pixels in the second mode. Furthermore, since the pattern of the control signal CLK can be controlled separately for each area, it is possible to change the pattern of the control signal CLK depending on the luminance of light incident on the area thereby further suppressing the degradation in the image quality.

In the example shown in FIG. 13, the control circuit 216 controls four pixels, but the number of pixels controlled by one control circuit 216 is not limited to four. For example, each pixel may be connected to one control circuit 216, and the pattern of the control signal CLK may be controlled separately for each pixel, or alternatively, five or more pixels may be connected to one control circuit 216.

Third Embodiment

Figure 14:
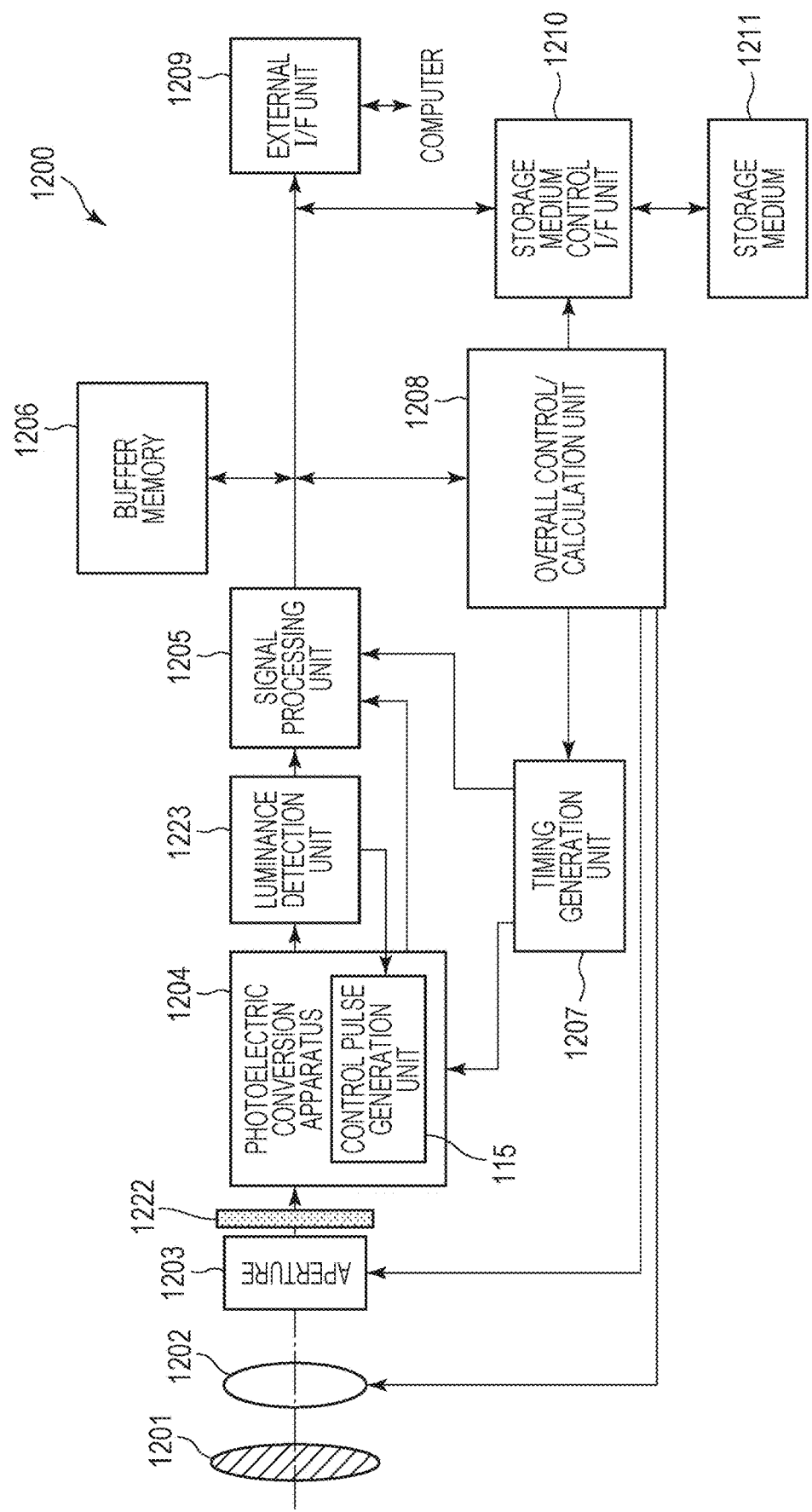
FIG. 14 is a block diagram of a photodetection system of according to a third embodiment.

FIG. 14 is a block diagram showing a configuration of a photodetection system 1200 according to a third embodiment.

The photodetection system 1200 according to this embodiment includes a photoelectric conversion apparatus 1204. As for the photoelectric conversion apparatus 1204, the photoelectric conversion apparatus according to one of the embodiments described above may be used. The photodetection system 1200 can be used as, for example, an imaging system. Specific examples of the imaging system include a digital still camera, a digital camcorder, a security camera, and the like. In the example shown in FIG. 14, the photodetection system 1200 is used as a digital still camera.

The photodetection system 1200 shown in FIG. 14 includes a photoelectric conversion apparatus 1204, a lens 1202 for forming an optical image of a subject on the photoelectric conversion apparatus 1204, an aperture 1203 for varying the amount of light passing through the lens 1202, and a barrier 1201 for protect the lens 1202. The lens 1202 and the aperture 1203 form an optical system that collects light on the photoelectric conversion apparatus 1204. A shutter 1222 is disposed between the diaphragm 1203 and the photoelectric conversion apparatus 1204. The exposure period for the photoelectric conversion apparatus is controlled by opening and closing the shutter 1222.

The photodetection system 1200 includes a signal processing unit 1205 that processes an output signal provided from the photoelectric conversion apparatus 1204. The signal processing unit 1205 performs signal processing, such as various correction processing and compression processing, on the input signal as necessary, and outputs the resultant signal. The photodetection system 1200 includes a luminance detection unit 1223 disposed between the photoelectric conversion apparatus 1204 and the signal processing unit 1205. The luminance detection unit 1223 detects the luminance of a subject and transmits luminance information indicating the luminance of the subject to the control pulse generation unit 115, the timing generation unit 1207, and the signal processing unit 1205. Based on the luminance information of the subject, the control pulse generation unit 115 controls the timing of the control signal CLK supplied to the switch. The photodetection system 1200 further includes a buffer memory unit 1206 for temporarily storing image data and an external interface unit (an external I/F unit) 1209 for communicating with an external computer or the like. The photodetection system 1200 further includes a storage medium 1211 such as a semiconductor memory for storing and reading image data, and a storage medium control interface unit (storage medium control I/F unit) 1210 via which to store or read image data in/from the storage medium 1211. The storage medium 1211 may be disposed inside the photodetection system 1200 or may be detachable. Communication between the storage medium control I/F unit 1210 and the storage medium 1211 and/or communication with the external I/F unit 1209 may be performed wirelessly.

The photodetection system 1200 further includes an overall control/calculation unit 1208 that performs various calculations and controls the entire digital still camera, and a timing generation unit 1207 that outputs various timing signals to the photoelectric conversion apparatus 1204 and the signal processing unit 1205. The timing signal or the like may be input from the outside. In this case, the photodetection system 1200 may include at least the photoelectric conversion apparatus 1204 and the signal processing unit 1205 that processes an output signal provided from the photoelectric conversion apparatus 1204. The overall control/calculation unit 1208 and the timing generation unit 1207 may be configured to perform part or all of the control functions of the photoelectric conversion apparatus 1204.

The photoelectric conversion apparatus 1204 outputs an image signal to the signal processing unit 1205. The signal processing unit 1205 performs particular signal processing on the image signal output from the photoelectric conversion apparatus 1204, and outputs a result as image data. The signal processing unit 1205 generates an image using the image signal. The signal processing unit 1205 may perform distance measurement calculation on the signal output from the photoelectric conversion apparatus 1204. The signal processing unit 1205 and the timing generation unit 1207 may be disposed in the photoelectric conversion apparatus. That is, the signal processing unit 1205 and the timing generation unit 1207 may be provided on a substrate on which pixels are arranged, or may be provided on another substrate. By forming an imaging system using the photoelectric conversion apparatus according to one of the embodiments described above, it is possible to realize an imaging system capable of acquiring a higher quality image.

Fourth Embodiment

An example of functions of the above-described imaging system is an automatic exposure control (AE) function. The photodetection system 1200 controls the exposure not only by controlling the exposure period for the photoelectric conversion apparatus 1204 and the aperture value of the aperture 1203 based on the luminance information related to a subject detected by luminance detection unit 1223, but also by controlling the timing of the control signal CLK. That is, based on the luminance information related to the subject, a determination is made as to whether the imaging environment is in low illuminance or high illuminance. When the imaging environment is in high illuminance, the image mode is set to a mode A and the exposure period and the aperture value are controlled in the mode A, while when the imaging environment is in low illuminance, the imaging mode is set to a mode B and the number of control signals CLK is controlled in the mode B. The controlling of the number of control signals CLK in the mode B can be performed, for example, as described above in the first embodiment. This provides an effect that even when the exposure control value changes depending on the imaging scene, it is possible automatically control the exposure such that the influence of an abnormal output due to a defect is reduced as described above thereby suppressing the degradation in image quality.

Figure 15:
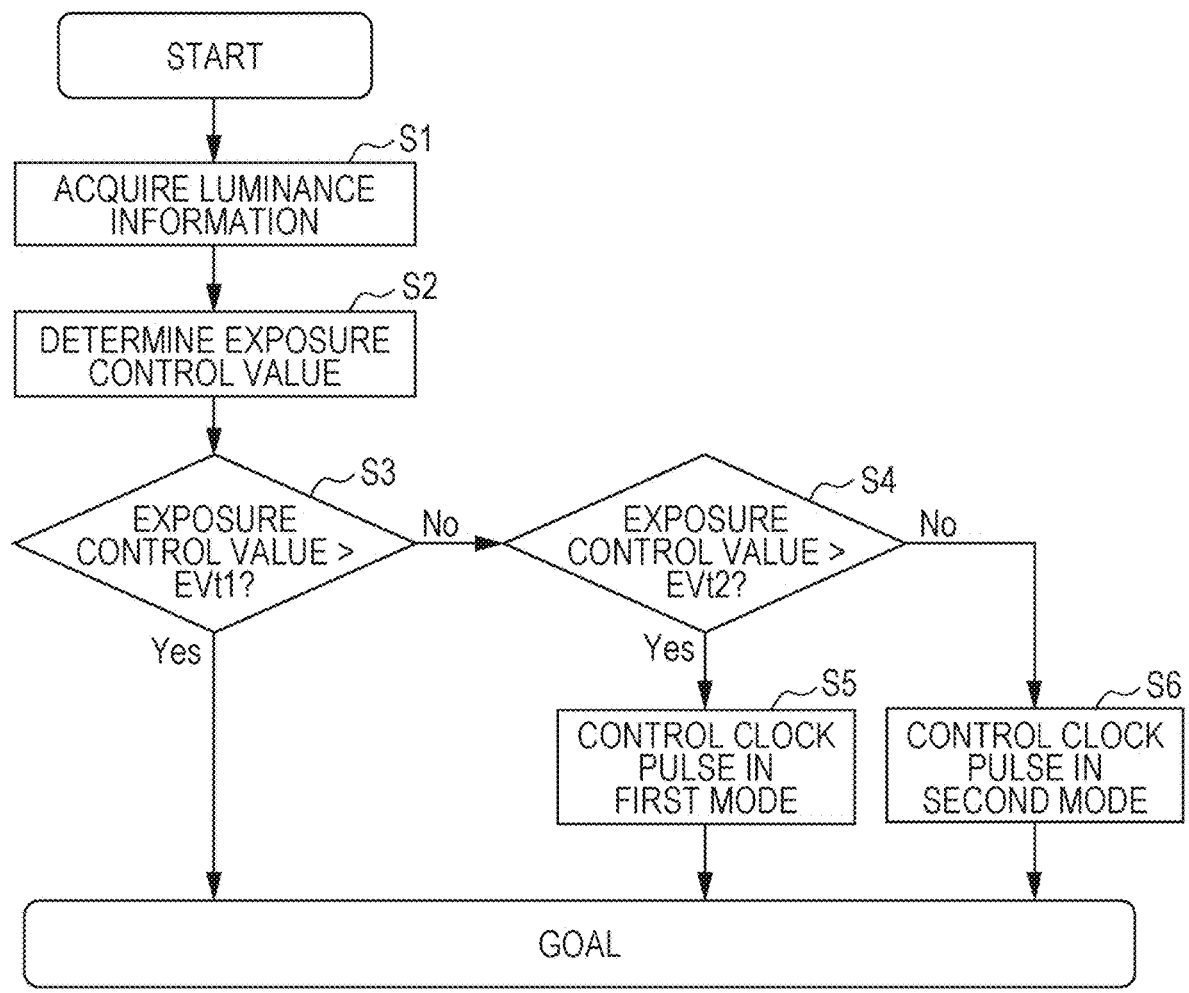
FIG. 15 is a flowchart of an automatic exposure control operation according to a fourth embodiment.

FIG. 15 shows an example of an automatic exposure control flow according to the present embodiment.

Figure 16A:
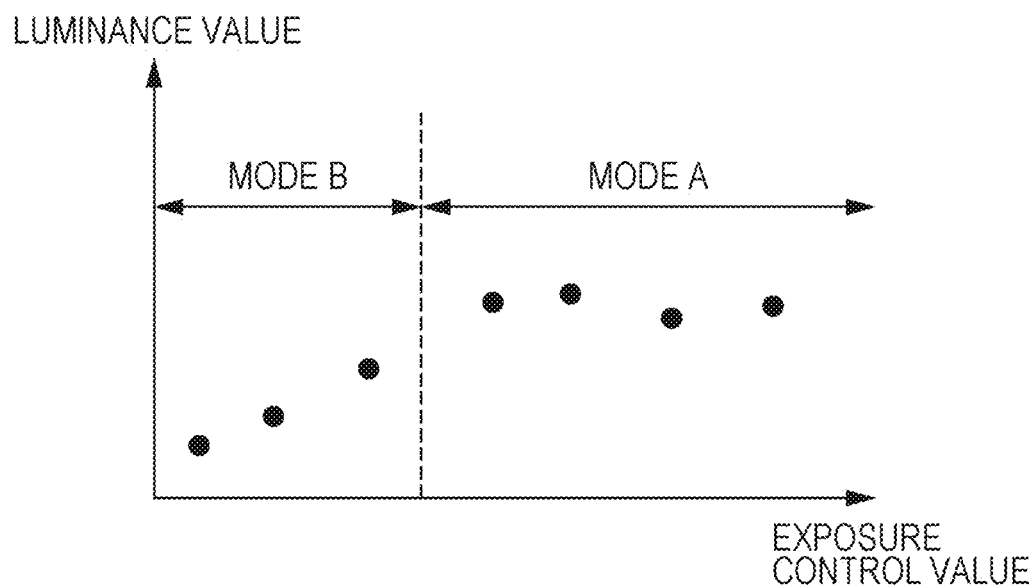
FIG. 16A is a diagram showing a subject luminance value in the automatic exposure control according to the fourth embodiment.
Figure 16B:
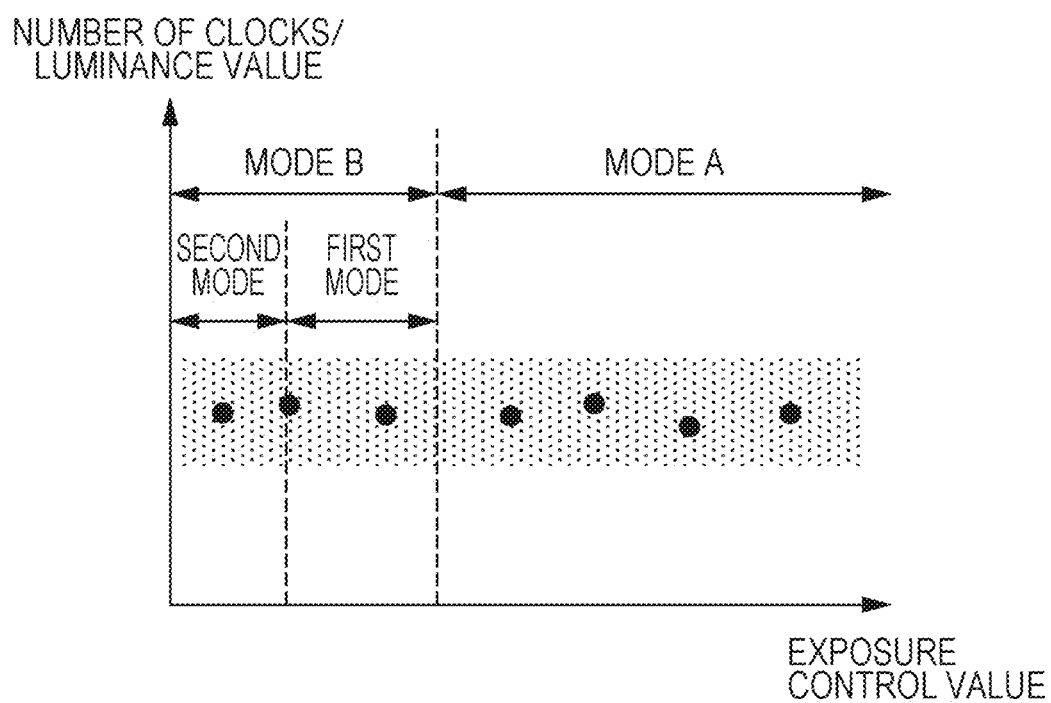
FIG. 16B is a diagram showing the number of control signals and the subject luminance value in the automatic exposure control according to the fourth embodiment.

In the flow shown in FIG. 15, first, luminance information related to a subject is acquired (S1). An exposure control value is then calculated based on the acquired luminance information (S2). The calculated exposure control value is compared with a threshold value EVt1 (S3). When the exposure control value is equal to or higher than the threshold value EVt1, it is judged that the imaging environment is in high illuminance, and the imaging mode is set to the mode A. In a case where the calculated exposure control value is equal smaller than the threshold value EVt1, the exposure control value is further compared with a threshold value Evt2 (S4). When the exposure control value is equal to or higher than the threshold value EVt2, it is determined that the imaging environment is in low illuminance, and the imaging mode is set to the first mode according to the first embodiment and the number of control signals CLK is controlled in the first mode. When this control process is completed, the automatic exposure control is ended (S5). When the exposure control value is equal to or lower than the threshold value EVt2, it is determined that the imaging environment is in further lower illuminance, and the imaging mode is set to the second mode according to the first embodiment and the number of control signals CLK is controlled in the second mode. When this control process is completed, the automatic exposure control is ended (S6). In the automatic exposure control described above, the threshold values EVt1 and EVt2 provide determination criterial for determining the luminance of the imaging environment. EVt1 and EVt2 may be set to values that make it possible to suppress, even in a low luminance environment, an abnormal output due to a pixel defect such as that described above in previous embodiments. FIG. 16A shows a subject luminance value calculated from an image signal output from the photoelectric conversion apparatus 1204 in a situation in which the automatic exposure control according to the present embodiment is performed. FIG. 16B shows the ratio of the subject luminance value to the number of control signals CLK obtained when the automatic exposure control according to the present embodiment is performed.

As shown in FIG. 16A, when the exposure control value is large in a high luminance environment, the imaging mode is set to the mode A and the exposure period and aperture value are set such that the subject luminance value is within a particular luminance range. On the other hand, when the exposure control value is small as in a low luminance environment, the imaging mode is set to the mode B, and controlling of the exposure period and aperture value is not performed. Therefore, the subject luminance value decreases as the exposure control value decreases. However, as shown in FIG. 16B, when the exposure control value is small, the number of control signals CLK is controlled such that the ratio of the subject luminance value to the number of control signals CLK is within the particular control range. The controlling of the control signal CLK may be performed, for example, according to the first embodiment described above. Let it be assumed here that the imaging environment has changed from a state in which the exposure control value is large in a high luminance environment to a state in which the exposure control value is small in a low luminance environment. In this case, in response to a change in luminance or exposure control value, the imaging mode may be switched in the following order: mode A; first mode of mode B; and second mode of mode B. Here, in the mode B, it may be desirable that the above-described particular control range is narrow such that when a change occurs in the exposure control value, the appearance of an abnormal output due to a pixel defect does not change significantly in response to the change in the exposure control value. More specifically, it may be desirable that the upper limit of the particular control range is equal to or smaller than twice the lower limit. The control range is not limited to this, and the control range may be set in other manners as long as an abnormality output caused by a defect or the like is unnoticeable. In the mode A, it is assumed that the imaging environment is in high luminance. However, an abnormal output due to a defect or the like is not noticeable under a high illuminance condition, and thus the ratio of the subject luminance value to the number of control signals CLK does not necessarily have to fall within the particular control range.

By performing the automatic exposure control in the above-described manner, it is possible, even when the exposure control value changes depending on an imaging scene, to obtain an imaging signal without significantly influenced by an abnormal output caused by a pixel defect or the like by using the control method according to the first or second embodiment described above. This makes it possible to perform the automatic exposure control while suppressing degradation in image quality.

Fifth Embodiment

FIG. 17 is a block diagram showing an example of a configuration of a distance image sensor, which is an electronic device realized using the photoelectric conversion apparatus according to one of the embodiments described above.

As shown in FIG. 17, the distance image sensor 401 includes an optical system 407, a photoelectric conversion apparatus 408, an image processing circuit 404, a monitor 405, and a memory 406. The distance image sensor 401 acquires a distance image indicating a distance to a subject by receiving light (modulated light or pulsed light) that is projected from a light source apparatus 409 toward the subject and reflected by the surface of the subject.

The optical system 407 includes one or a plurality of lenses and functions to conduct image light (incident light) from a subject to the photoelectric conversion apparatus 408 so as to form an image on a light receiving surface (a sensor unit) of the photoelectric conversion apparatus 408.

As the photoelectric conversion apparatus 408, the photoelectric conversion apparatus according to one of the embodiments described above is used. A distance signal indicating a distance is obtained from a light reception signal output from the photoelectric conversion apparatus 408, and the resultant distance signal is supplied to the image processing circuit 404.

The image processing circuit 404 performs image processing for constructing a distance image based on the distance signal supplied from the photoelectric conversion apparatus 408. The distance image (image data) obtained by the image processing is supplied to the monitor 405 and displayed thereon, or supplied to the memory 406 and stored (recorded) therein.

In the distance image sensor 401 configured in the above-described manner, use of the photoelectric conversion apparatus with higher-quality pixels described above makes it possible to acquire, for example, a more accurate distance image.

Sixth Embodiment

The techniques according to the present disclosure (the present techniques) can be applied to various products. For example, the techniques according to the present disclosure may be applied to endoscopic surgery systems.

Figure 18:
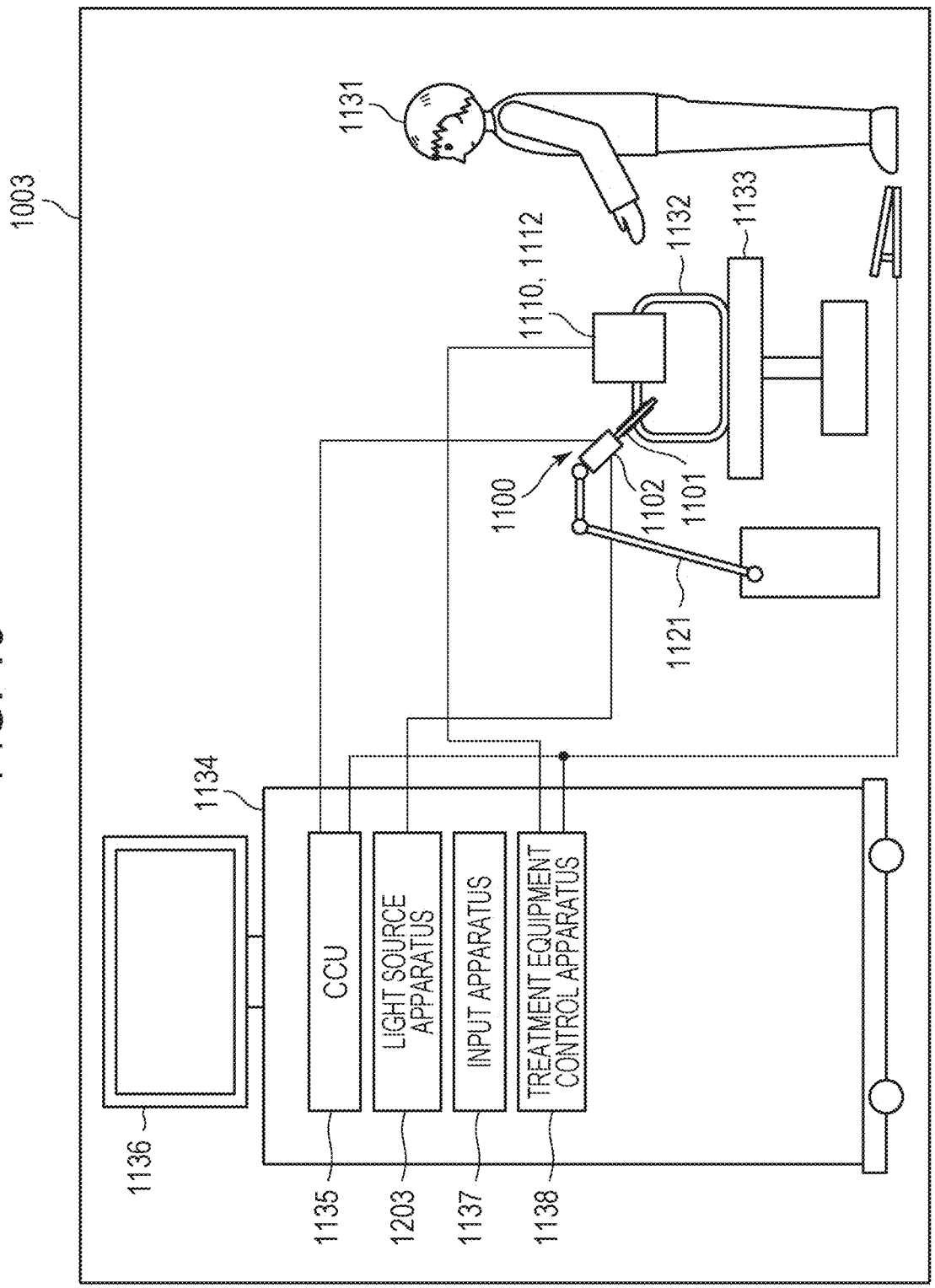
FIG. 18 is a block diagram of a photodetection system according to a sixth embodiment.

FIG. 18 is a schematic diagram showing an example of a configuration of an endoscopic surgery system to which the technique according to the present disclosure (the present technique) can be applied.

More specifically, FIG. 18 illustrates a manner in which a surgeon (doctor) 1131 performs surgery on a patient 1132 on a patient bed 1133 using an endoscopic surgery system 1003. As shown, the endoscopic surgery system 1003 includes an endoscope 1100, a surgical tool 1110, and a cart 1134 equipped with various apparatuses for endoscopic surgery.

The endoscope 1100 includes a lens barrel 1101 whose anterior part with a particular length is inserted in body cavity of the patient 1132, and a camera head 1102 connected to a base end of the lens barrel 1101. In the example shown in FIG. 18, the endoscope 1100 is configured as a so-called rigid endoscope having the rigid barrel 1101. However the endoscope 1100 may be configured as a so-called flexible endoscope having a flexible barrel.

An opening in which an objective lens is fitted is formed at the tip of the lens barrel 1101. A light source apparatus 1203 is connected to the endoscope 1100. Light generated by the light source apparatus 1203 is guided to the tip of the lens barrel by a light guide extending inside the lens barrel 1101. This light is emitted through the objective lens toward an observation target object in the body cavity of the patient 1132. The endoscope 1100 may be a forward-viewing endoscope, a forward-oblique viewing endoscope, or a side viewing endoscope.

An optical system and a photoelectric conversion apparatus are provided inside the camera head 1102, and reflected light (observation light) from the observation target is focused on the photoelectric conversion apparatus by the optical system. The observation light is photoelectrically converted by the photoelectric conversion apparatus into an electric signal corresponding to the observation light. As a result, an image signal corresponding to the observation image is obtained. As the photoelectric conversion apparatus, the photoelectric conversion apparatus described in one of the embodiments described above can be used. The image signal is transmitted as RAW data to the camera control unit (CCU) 1135.

The CCU 1135 includes a CPU (Central Processing Unit), a GPU (Graphics Processing Unit), etc., and generally controls the operations of the endoscope 1100 and the display apparatus 1136. Furthermore, the CCU 1135 receives the image signal from the camera head 1102, and performs various image processing such as development processing (demosaic processing) on the image signal for displaying an image based on the image signal.

The display apparatus 1136 displays, under the control of the CCU 1135, the image based on the image signal subjected to the image processing by the CCU 1135.

The light source apparatus 1203 includes a light source such as an LED (Light Emitting Diode), and supplies irradiation light to the endoscope 1100 when an image of an operation part or the like is captured.

The input apparatus 1137 functions as an input interface to the endoscopic surgery system 1003. A user can input various information and instructions to the endoscopic surgery system 1003 via the input apparatus 1137.

The treatment equipment control apparatus 1138 controls driving of energy treatment equipment 1112 for cauterization or incision of a tissue, sealing of blood vessels, etc.

The light source apparatus 1203 for supplying irradiation light to the endoscope 1100 when an image of an operation part is captured may be realized using a white light source using an LED, a laser light source, or a combination thereof.

In a case where the white light source is realized by a combination of RGB laser light sources, it is possible to accurately control the output intensity and output timing of each color (each wavelength), and thus the light source apparatus 1203 can adjust the white balance of the captured image. Furthermore, in this case, an image may captured such that supplying of the laser light from each of the RGB laser light sources to the observation target is performed a time-division manner, and the imaging device of the camera head 1102 is driven in synchronization with the light supplying timing so as to capture an image of each color in the time-division manner. In this method, a color image can be obtained without providing a color filter on the imaging device.

The light source apparatus 1203 may be controlled such that the intensity of the output light is changed at predetermined time intervals. By controlling the imaging device of the camera head 1102 to be driven in synchronization with the timing of the change in the light intensity to acquire images in a time-division manner and combining the images, it is possible to generate an image with a high dynamic range without having underexposure and overexposure.

The light source apparatus 1203 may be configured to be able to supply light in a predetermined wavelength band for special light observation. The special light observation is realized by, for example, dependence of absorption of light by body tissues on wavelength of light absorption in body tissues. More specifically, a target issue such as a blood vessel on the surface layer of a mucous membrane may be irradiated with light with a narrow band as compared with normal irradiation light (that is, white light) thereby obtaining an image of the target issue with high contrast.

Alternatively, the special light observation may be realized by fluorescence observation in which an image is obtained by fluorescence which occurs when a target is irradiated excitation light. In the fluorescence observation, a body tissue is irradiated with excitation light, and fluorescence that occurs on the body tissue in response to the excitation by light is observed, or a reagent such as indocyanine green (ICG) is locally injected into the body tissue and the body tissue is irradiated with excitation light with a wavelength corresponding to the fluorescence wavelength of the reagent and a resultant fluorescence image is observed. As described above, the light source apparatus 1203 may be configured to be capable of supplying narrow band light and/or excitation light for the special light observation.

Seventh Embodiment

Figure 19A:
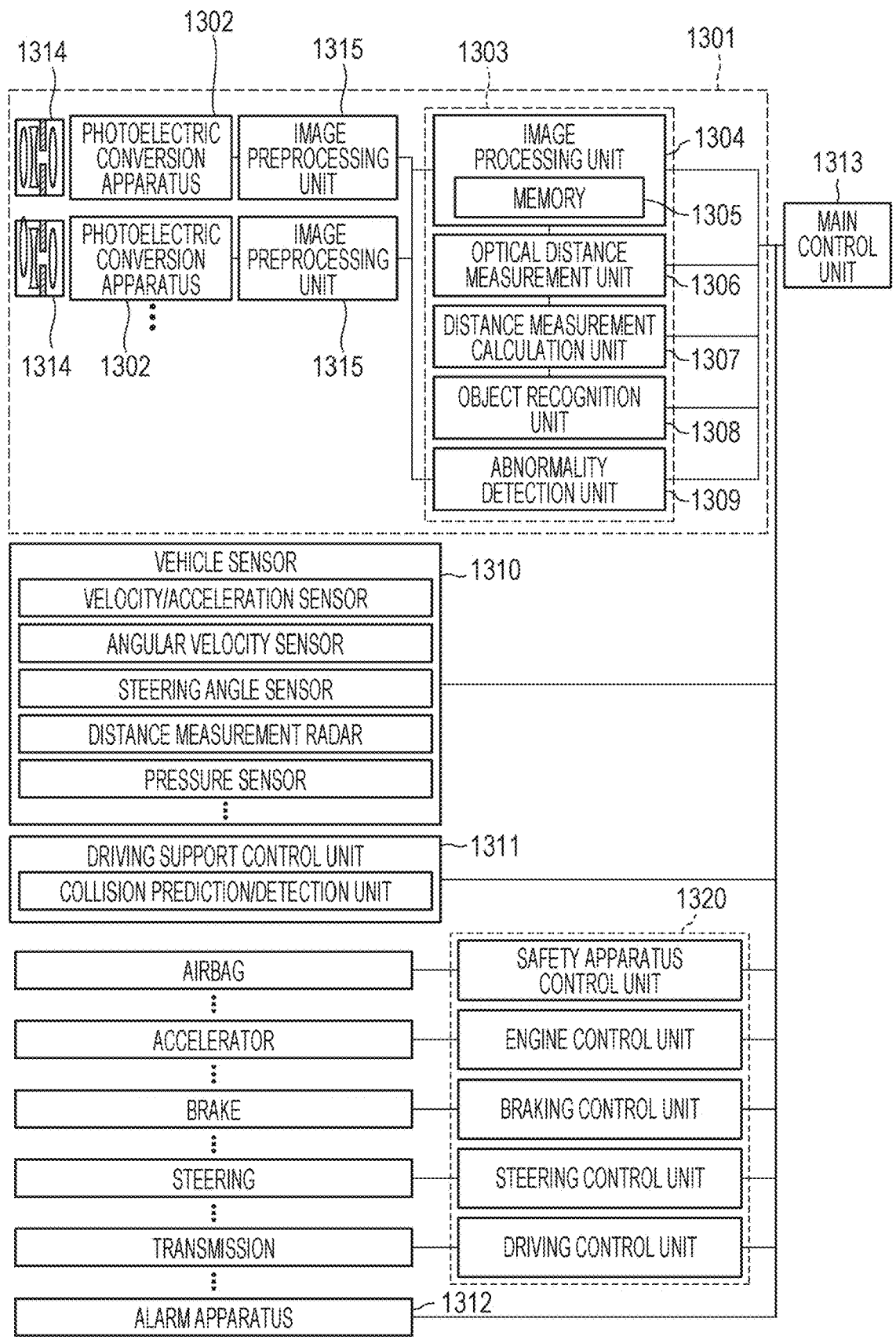
FIG. 19A is a block diagram of a photoelectric conversion system according to a seventh embodiment.
Figure 19B:
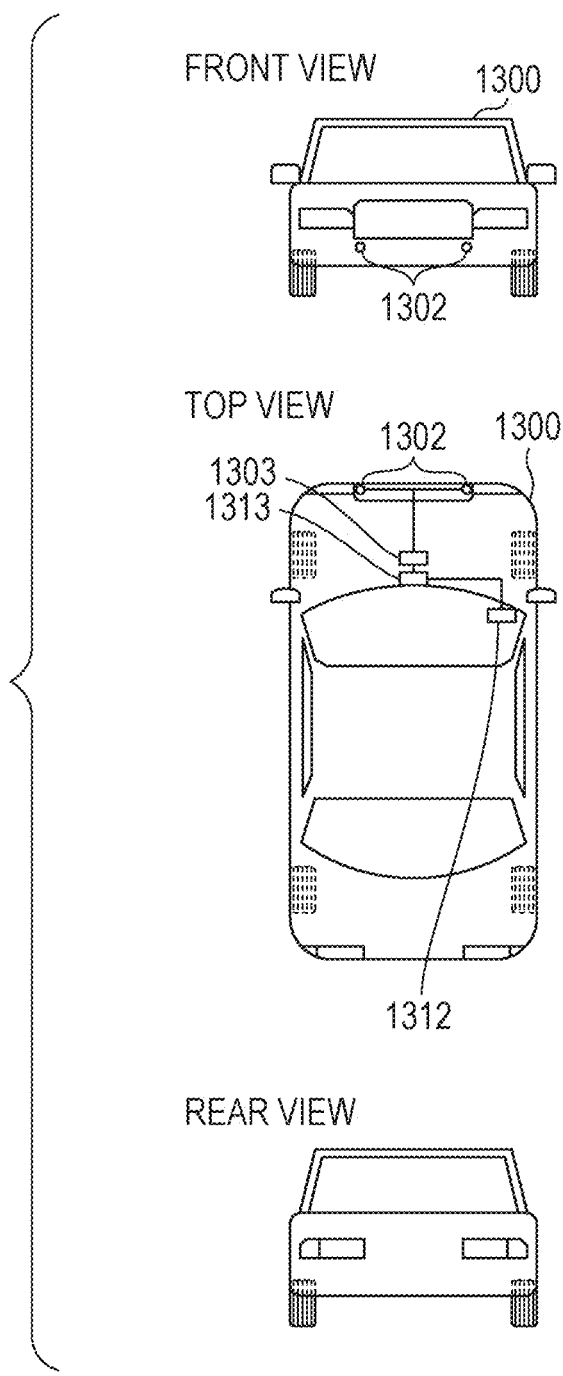
FIG. 19B is a diagram illustrating a mobile body according to the eighth embodiment.
Figure 20:
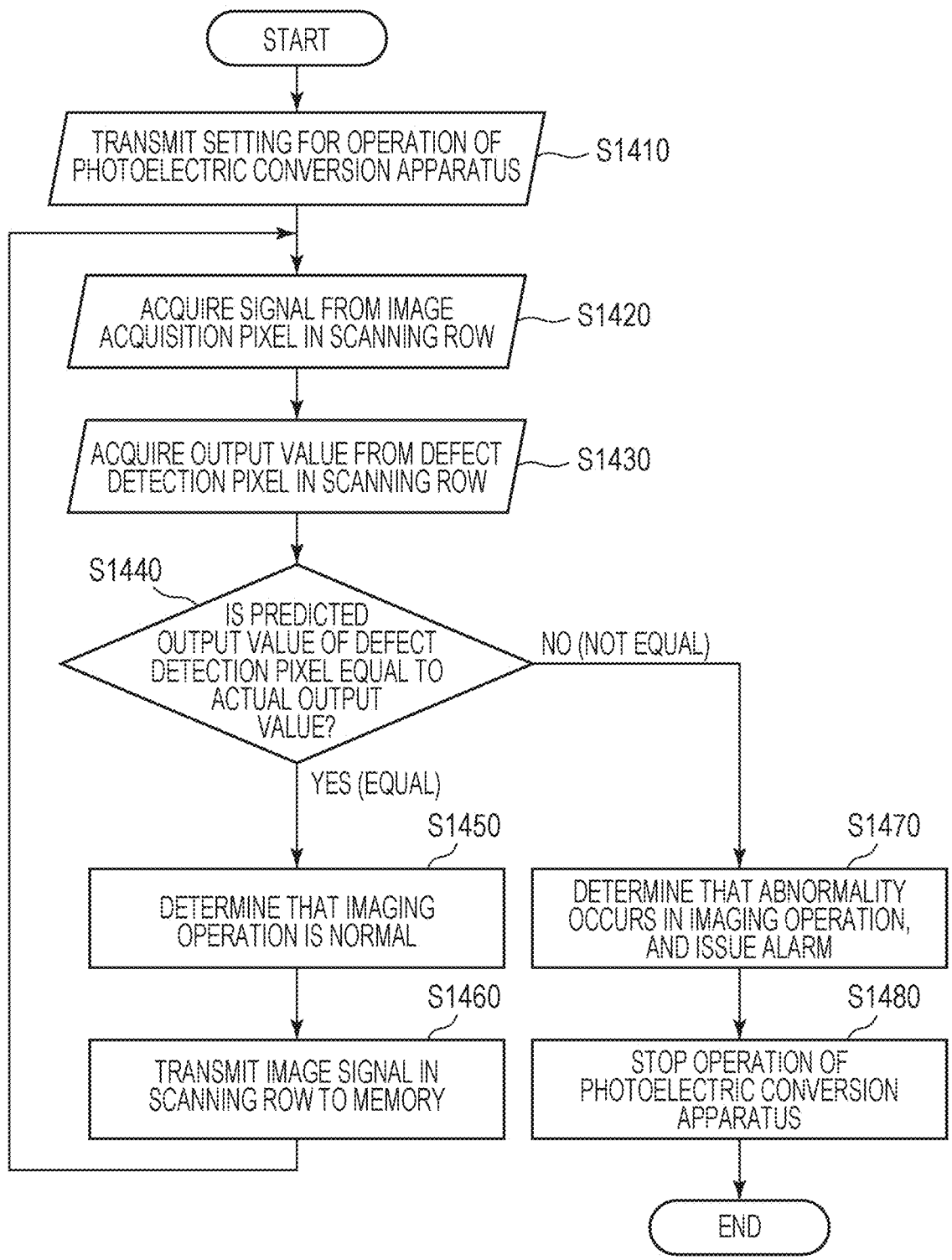
FIG. 20 is a flowchart related to a photodetection system according to the seventh embodiment.

A photodetection system and a mobile body according to a seventh embodiment are described below with reference to FIGS. 19A and 19B and FIG. 20. FIG. 19A is a block diagram of a photoelectric conversion system according to a seventh embodiment, and FIG. 19B is a diagram illustrating a mobile body according to the eighth embodiment. FIG. 20 is a flow chart showing an operation of the photodetection system according to the present embodiment. In this embodiment, an in-vehicle camera is described as an example of the photodetection system.

More specifically, FIG. 19B shows an example of a vehicle system and FIG. 19A shows an example of a photodetection system for imaging disposed in the vehicle system. The photodetection system 1301 includes a photoelectric conversion apparatus 1302, an image preprocessing unit 1315, an integrated circuit 1303, and an optical system 1314. The optical system 1314 forms an optical image of a subject on the photoelectric conversion apparatus 1302. The photoelectric conversion apparatus 1302 converts the optical image of the subject formed by the optical system 1314 into an electric signal. The photoelectric conversion apparatus 1302 may be a photoelectric conversion apparatus according to one of the embodiments described above. The image preprocessing unit 1315 performs predetermined signal processing on the signal output from the photoelectric conversion apparatus 1302. The function of the image preprocessing unit 1315 may be incorporated in the photoelectric conversion apparatus 1302. The photodetection system 1301 includes at least two sets of the optical system 1314, the photoelectric conversion apparatus 1302, and the image preprocessing unit 1315, and is configured such that a signal output from the image preprocessing unit 1315 of each set is input to the integrated circuit 1303.

The integrated circuit 1303 is an integrated circuit designed for use in imaging system applications, and includes an image processing unit 1304 including a memory 1305, an optical distance measurement unit 1306, a distance measurement calculation unit 1307, an object recognition unit 1308, and an abnormality detection unit 1309. The image processing unit 1304 performs image processing such as development processing and/or defect correction processing on the output signal provided from the image preprocessing unit 1315. The memory 1305 temporarily stores the captured image and information indicating a position of a defect pixel. The optical distance measurement unit 1306 performs focusing of an image of a subject, and distance measurement processing. The distance measurement calculation unit 1307 calculates the distance measurement information from a plurality of image data acquired by the plurality of photoelectric conversion apparatuses 1302. The object recognition unit 1308 recognizes a subject such as a car, a road, a sign, or a person. When the abnormality detection unit 1309 detects an abnormality in the photoelectric conversion apparatus 1302, the abnormality detection unit 1309 notifies a main control unit 1313 of the abnormality.

The integrated circuit 1303 may be realized by hardware designed for dedicated use or by a software module, or may be realized by a combination thereof. Alternatively, the integrated circuit 1303 may be realized by an FPGA (Field Programmable Gate Array), an ASIC (Application Specific Integrated Circuit), or the like, or may be realized by a combination thereof.

The main control unit 1313 generally controls the operations of the photodetection system 1301, the vehicle sensor 1310, the control unit 1320, and the like. The main control unit 1313 may not be provided. In this case, a communication interface may be provided in each of the photodetection system 1301, the vehicle sensor 1310, and the control unit 1320, and a control signal may be transmitted among the photodetection system 1301, the vehicle sensor 1310, and the control unit 1320 via the communication network (according to, for example, CAN standard).

The integrated circuit 1303 has a function of transmitting a control signal or a setting value to the photoelectric conversion apparatus 1302 according to a control signal received from the main control unit 1313 or according to a control signal generated inside the integrated circuit 1303.

The photodetection system 1301 is connected to the vehicle sensor 1310, and can detect a running state in terms of the vehicle speed, yaw rate, steering angle and the like of the vehicle on which the photodetection system 1301 is disposed and also can detect a state of the environment outside the vehicle, the state of other vehicles/obstacles. The vehicle sensor 1310 also functions as a distance information acquisition unit for acquiring distance information indicating a distance to an object. The photodetection system 1301 is connected to a driving support control unit 1311 that provides various driving support such as automatic steering, automatic cruising, collision prevention, and/or the like. A collision prediction/detection function is also provided. In this function, a collision with another vehicle/object is predicted or an occurrence of a collision is detected based on a detection result provided by the photodetection system 1301 and/or the vehicle sensor 1310. When a collision is predicted, a control operation to avoid the collision is performed, and a safety apparatus is activated in the event of the collision.

The photodetection system 1301 is also connected to an alarm apparatus 1312 that issues an alarm to a driver based on the prediction/detection result by the collision prediction/detection unit. For example, in a case where the prediction/detection result by the collision prediction/detection unit indicates that a collision is going to occur with a high probability, the main control unit 1313 controls the vehicle to avoid the collision or reduce a damage by applying the brakes, releasing the accelerator, or suppressing the engine output. The alarm apparatus 1312 warns the user by sounding an alarm, displaying alarm information on a display screen of a car navigation system or a meter panel, or vibrating a seat belt or a steering wheel.

In the present embodiment, an image around the vehicle is captured by the photodetection system 1301. More specifically, for example, an image of an environment in front of or behind the vehicle is captured. FIG. 19B shows an example of a manner of disposing the photodetection systems 1301 for a case where an image of an environment in front of the vehicle is captured by the photodetection systems 1301.

The two photoelectric conversion apparatuses 1302 are disposed on the front of the vehicle 1300. More specifically, the center line of the external shape (for example, the width) of the vehicle 1300 extending in forward/backward running direction is taken as an axis of symmetry, and the two photoelectric conversion apparatuses 1302 are disposed line-symmetrically about the axis of symmetry. This configuration may be desirable for acquiring distance information indicating the distance between the vehicle 1300 and an imaging target object, and may be desirable for determining the possibility of collision. It is desirable that the photoelectric conversion apparatuses 1302 are disposed so as not to obstruct the field of view of the driver who is trying to view the situation outside the vehicle 1300 from the driver's seat. In one embodiment, the alarm apparatus 1312 is disposed such that the driver can easily view the alarm apparatus 1312.

Next, a failure detection operation of the photoelectric conversion apparatus 1302 in the photodetection system 1301 is described with reference to FIG. 20. The failure detection operation of the photoelectric conversion apparatus 1302 is performed according to steps S1410 to S1480 shown in FIG. 20.

In step S1410, startup setting of the photoelectric conversion apparatus 1302 is performed. That is, the setting for the operation of the photoelectric conversion apparatus 1302 is transmitted from the outside of the photodetection system 1301 (for example, from the main control unit 1313) or the inside of the photodetection system 1301, and the imaging operation and the failure detection operation of the photoelectric conversion apparatus 1302 are started.

Next, in step S1420, a pixel signal is acquired from a normal pixel. In next step S1430, an output value from a failure detection pixel, provided for failure detection, is acquired. The failure detection pixel includes a photoelectric conversion element as with the normal pixel. A particular voltage is written in this photoelectric conversion element. The failure detection pixel outputs a signal corresponding to the voltage written in the photoelectric conversion element. The steps S1420 and S1430 may be reversed in order.

Next, in step S1440, a determination is performed as to whether an actual output value from the failure detection pixel is consistent or inconsistent with the expected output value for the failure detection pixel. In a case where the determination indicates that the actual output value is consistent with the expected output value, the processing flow proceeds to step S1450. In S1450, it is determined that the imaging operation is normal, and the processing flow proceeds to step S1460. In step S1460, pixel signals of a scanning row are transmitted to the memory 1305 and temporarily stored therein. After that, the processing flow returns to step S1420 and the failure detection operation is continued. In a case where the determination in step S1440 indicates that the actual output value is inconsistent with the expected output value, the processing flow proceeds to step S1470. In step S1470, it is determined that there is an abnormality in the imaging operation, and an alarm is issued to the main control unit 1313 or the alarm apparatus 1312. The alarm apparatus 1312 displays, on the display unit, information indicating that the abnormality has been detected. After that, in step S1480, the photoelectric conversion apparatus 1302 is stopped, and the operation of the photodetection system 1301 is ended.

In the present embodiment, by way of example, an iteration loop in the flowchart is executed for each row. However, the iteration loop for the failure detection may be executed for each of two or more rows, or for each frame. In step S1470, the alarm may be issued to the outside of the vehicle via a wireless network.

In the embodiment described above, by way of example, the control is performed to avoid a collision with another vehicle. However, the present embodiment can also be applied to a control to automatically drive following another vehicle, a control to automatically drive so as not to go out of a lane, and the like. Furthermore, the photodetection system 1301 can be applied not only to a vehicle but also to a mobile body (a mobile apparatus) such as a ship, an aircraft, an industrial robot, and/or the like. Furthermore, it can be applied not only to mobile bodies but also to a wide variety of devices that use object recognition processing, such as intelligent transportation systems (ITS).

The photoelectric conversion apparatus of according to the present disclosure may be configured to be capable of acquiring various information such as distance information.

Eighth Embodiment

Figure 21A:
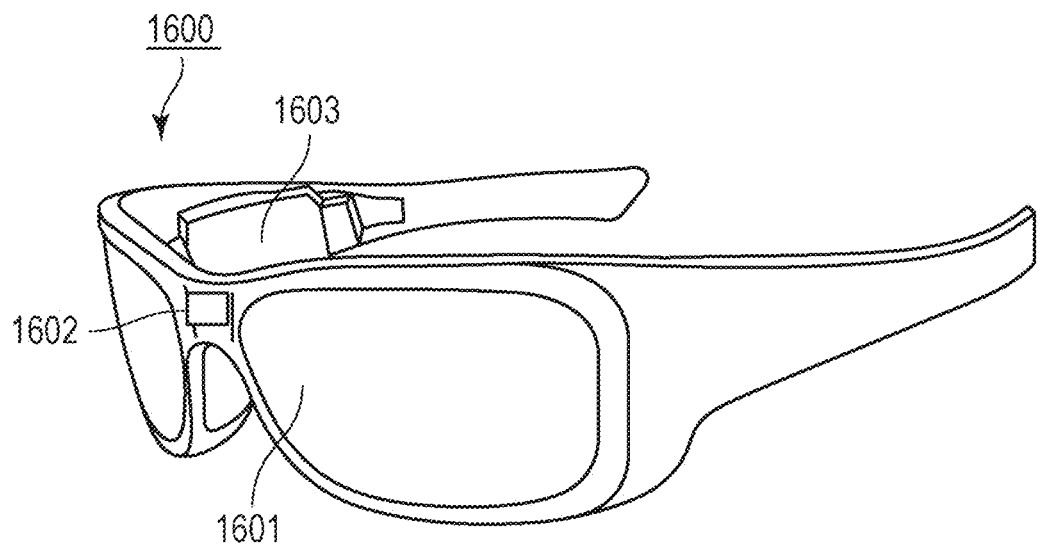
FIGS. 21A and 21B are each a diagram showing a specific example of an electronic device according to an eighth embodiment.

FIG. 21A illustrates, as one of examples of applications, eyeglasses 1600 (smart glasses). The eyeglasses 1600 have a photoelectric conversion apparatus 1602. The photoelectric conversion apparatus 1602 may be a photoelectric conversion apparatus according to one of the embodiments described above. A display apparatus including a light emitting device such as an OLED or an LED may be provided on a back surface side of a lens 1601. One or more photoelectric conversion apparatuses 1602 may be provided. When a plurality of photoelectric conversion apparatuses are used, types thereof may be the same or different. The positions where the photoelectric conversion apparatuses 1602 are disposed are not limited to those shown in FIG. 21A.

The eyeglasses 1600 further include a control apparatus 1603. The control apparatus 1603 functions as a power source for supplying power to the photoelectric conversion apparatus 1602 and to the display apparatus described above. The control apparatus 1603 controls the operations of the photoelectric conversion apparatus 1602 and the display apparatus. The lens 1601 has an optical system for focusing light on the photoelectric conversion apparatus 1602.

Figure 21B:
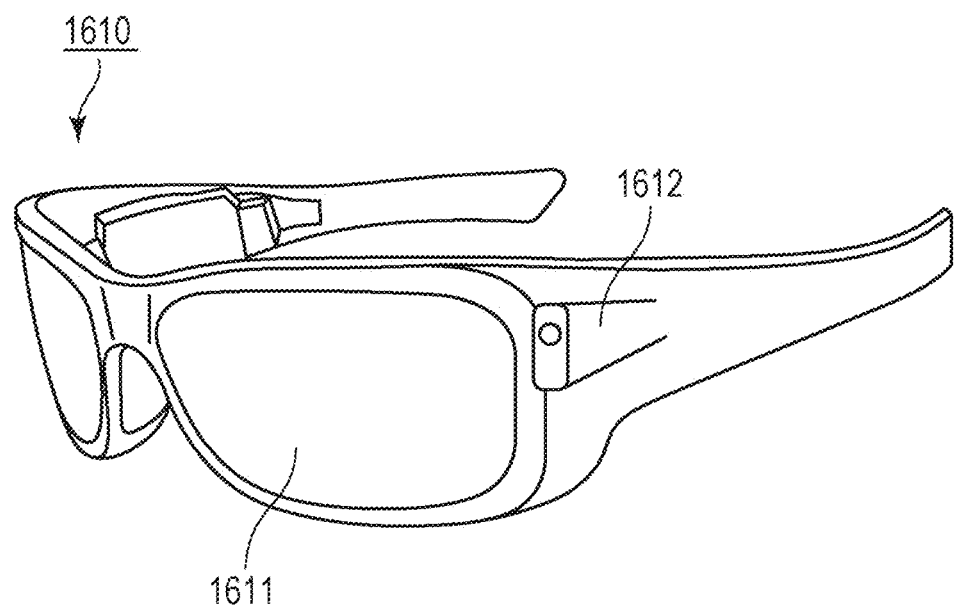

FIG. 21B illustrates another example of eyeglasses 1610 (smart glasses). The eyeglasses 1610 has a control apparatus 1612, wherein the control apparatus 1612 includes a display apparatus and a photoelectric conversion apparatus corresponding to the photoelectric conversion apparatus 1602. The lens 1611 has an optical system to project light thereon light generated by the display apparatus and the photoelectric conversion apparatus in the control apparatus 1612 thereby projecting an image on the lens 1611. The control apparatus 1612 functions as the power source for supplying electric power to the photoelectric conversion apparatus and the display apparatus, and functions to control the operations of the photoelectric conversion apparatus and the display apparatus. The control apparatus may include a line-of-sight detection unit that detects a line of sight of a user who wears the eyeglasses 1610. Infrared light may be used to detect the line of sight. An infrared light emitting unit emits infrared light toward an eyeball of the user who is gazing at the displayed image. An image of the eyeball can be obtained by detecting reflected light of the emitted infrared light from the eyeball by an imaging unit having a light receiving element. By providing a reducing unit for reducing light from the infrared emitting unit to the display unit as seen in a plan view, the degradation in the image quality is reduced.

The user's line of sight to the displayed image is detected from the image of the eyeball captured using the infrared light. An arbitrary known method can be used in the line-of-sight detection using the captured image of the eyeball. For example, a line-of-sight detection method based on a Purkinje image using reflection of irradiation light on a cornea can be used.

More specifically, the line-of-sight detection process is performed based on a pupillary corneal reflex method. The line of sight of the user is detected by calculating a line-of-sight vector representing a direction (a rotation angle) of the eyeball based on the image of the pupil and a Purkinje image included in the captured image of the eyeball using the pupillary corneal reflex method.

The display apparatus according to the present embodiment may include a photoelectric conversion apparatus having a light receiving element, and may control the image displayed on the display apparatus based on the user's line-of-sight information provided from the photoelectric conversion apparatus.

More specifically, the display apparatus determines a first field-of-view area being watched by the user and a second field-of-view area other than the first field-of-view area based on the line-of-sight information. The first field-of-view area and the second field-of-view area may be determined by the control apparatus of the display apparatus, or may receive information indicating the first field-of-view area and the second field-of-view area determined by an external control apparatus. In the display area of the display apparatus, the display resolution of the first field of view area may be controlled to be higher than the display resolution of the second field of view area. That is, the resolution of the second field-of-view area may be lower than that of the first field-of-view area.

The display area may include a first display area and a second display area different from the first display area. The priorities for the first display area and the second display area may be determined based on the line-of-sight information. The first field of view area and the second field of view area may be determined by the control apparatus of the display apparatus, or may receive those determined by the external control apparatus. The resolution of the high-priority region may be controlled higher than the resolution of the region other than the high-priority region. That is, the resolution of the area having a relatively low priority may be controlled to be low.

Note that the determination of the first field-of-view area and the determination of the higher-priority area may be performed using AI. The AI may be based on a model configured to estimate the angle of the line of sight and the distance to a target object ahead of the line of sight from an image of an eyeball wherein the model is built by performing learning using training data of an image of the eyeball and a direction in which the eyeball captured on the image was actually directed. The AI program may be possessed by the display apparatus, the photoelectric conversion apparatus, or the external apparatus. In a case where the AI program is possessed by the external apparatus, it is transferred to the display apparatus via communication.

In a case where the displaying is controlled based on the visual detection, it is possible to apply the technique to smart glasses further including a photoelectric conversion apparatus for capturing an image of the outside. Smart glasses can display captured external information in real time.

OTHER EMBODIMENTS

The present disclosure has been described above with reference to various embodiments. However, the present disclosure is not limited to these embodiments, and various modifications and changes are possible. The embodiments may be mutually applicable.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-001442 filed Jan. 7, 2021 and No. 2021-184190 filed Nov. 11, 2021, which are hereditary incorporated by reference herein in their entirety.

What is claimed is:

1. An apparatus comprising:
a photodiode including an anode and a cathode;
a switch connected to a node of one of the anode and the cathode and to a power supply line via which a driving voltage is supplied, and functioning to switch a resistance value between the node and the power supply line; and
a generation unit configured to generate pulse signals for controlling switching of the switch,
the apparatus being operable in one of two modes including a first mode and a second mode, the second mode being usable under a lower luminance condition than a luminance condition in the first mode, in an exposure period for acquiring one frame of signals, a number of the pulse signals in the second mode being smaller than a number of the pulse signals in the first mode.

2. The apparatus according to claim 1, wherein the number of the pulse signals in the second mode is equal to or smaller than one-half the number of the pulse signals in the first mode.

3. The apparatus according to claim 1, wherein in the exposure period for acquiring the one frame of signals, the number of the pulse signals in the second mode is smaller than 500.

4. The apparatus according to claim 1, further comprising a counter circuit,
wherein the counter circuit is disposed at a location such that the counter circuit overlaps the photodiode when seen in a plan view.

5. The apparatus according to claim 4, wherein a number of the pulse signals is smaller than a maximum count value of the counter circuit in the exposure period for acquiring one frame of signals.

6. The apparatus according to claim 1, wherein the apparatus has a pixel area in which a plurality of the photodiodes are arranged in the form of a two-dimensional array when seen in a plan view.

7. The apparatus according to claim 6, wherein in the second mode, the pulse signals are supplied to specific areas in the pixel area such that the pulse signals have different patterns depending on the specific areas.

8. The apparatus according to claim 1, wherein the pulse signals are a signal repeated with a repetition period.

9. The apparatus according to claim 1, wherein
the apparatus has a third mode, which is an imaging mode for use in luminance lower than in the first mode and higher than in the second mode, and
a number of the pulse signals in the third mode is greater than the number of the pulse signals in the second mode and smaller than the number of the pulse signals in the first mode.

10. The apparatus according to claim 1, wherein the exposure period for acquiring one frame of signals in the first mode is shorter than the exposure period for acquiring one frame of signals in the second mode.

11. The apparatus according to claim 1, wherein at least one of the pulse signals in the first mode and the pulse signals in the second mode have a mixture of plurality of repetition periods.

12. The apparatus according to claim 1, wherein
the switch is a MOS transistor,
one of nodes of the switch is connected to a cathode of the photodiode,
the other one of the nodes of the switch is connected to the power supply line, and
the pulse signals are supplied to a gate electrode of the switch.

13. The apparatus according to claim 1, wherein the photodiode is an avalanche photodiode.

14. The apparatus according to claim 13, wherein the photodiode is driven in a Geiger mode.

15. A system comprising:
the apparatus according to claim 1, and
a detection unit configured to detect luminance of a subject.

16. The system according to claim 15, wherein the mode is switched between the first mode and the second mode according to the detected luminance.

17. The system according to claim 16, wherein
an exposure control value is determined according to the detected luminance, and
the mode is switched between the first mode and the second mode according to a result of comparison between the exposure control value and a predetermined mode switching setting value.

18. The system according to claim 15, wherein the number of the pulse signals in the second mode is controlled such that a ratio of the number of the pulse signals to the detected luminance value falls within a particular control range.

19. The system according to claim 18, wherein the ratio of an upper limit value to a lower limit value in the particular control range is equal to or smaller than 2.

20. The system according to claim 15, further comprising a processing unit configured to process a signal output by the apparatus.

21. A mobile body comprising:
the apparatus according to claim 1, and
an acquisition unit configured to acquire distance information indicating a distance to a target object from distance measurement information obtained based on a signal provided by the apparatus,
the mobile body further including a control unit configured to control the mobile body based on the distance information.

* * * * *